(12) United States Patent
Katsianos et al.

(10) Patent No.: US 9,712,916 B2
(45) Date of Patent: Jul. 18, 2017

(54) BASS ENHANCEMENT SYSTEM

(71) Applicant: DTS LLC, Calabasas, CA (US)

(72) Inventors: Themis Katsianos, Highland, CA (US);
Oveal Jerome Walker, Canoga Park, CA (US)

(73) Assignee: DTS LLC, Calabasas, CA (US)

( * ) Notice: Subject to any disclaimer, the term of this patent is extended or adjusted under 35 U.S.C. 154(b) by 0 days.

(21) Appl. No.: 14/992,938

(22) Filed: Jan. 11, 2016

(65) Prior Publication Data

US 2016/0183000 A1 Jun. 23, 2016

Related U.S. Application Data

(63) Continuation of application No. 13/720,725, filed on Dec. 19, 2012, now Pat. No. 9,236,842.
(Continued)

(51) Int. Cl.
*H03G 3/00* (2006.01)
*H04R 3/04* (2006.01)
(Continued)

(52) U.S. Cl.
CPC ............... *H04R 3/04* (2013.01); *H03G 3/00* (2013.01); *H03G 3/3005* (2013.01);
(Continued)

(58) Field of Classification Search
CPC . H04R 27/00; H04R 5/02; H04R 5/04; H04R 3/04; H04R 1/1083; H04R 2460/01;
(Continued)

(56) References Cited

U.S. PATENT DOCUMENTS 1,616,639 A 2/1927 Sprague
1,951,669 A 3/1934 Ramsey
(Continued)

FOREIGN PATENT DOCUMENTS

CN 101373961 2/2009
CN 103460716 A 12/2013
(Continued)

OTHER PUBLICATIONS

Search Report issued in Application No. 101149862 on Feb. 25, 2016.
(Continued)

*Primary Examiner* — Akelaw Teshale
(74) *Attorney, Agent, or Firm* — Knobbe Martens Olson & Bear LLP

(57) ABSTRACT

A bass enhancement system can provide an enhanced bass effect for speakers, including relatively small speakers. The bass enhancement system can apply one or more bass enhancements to an input audio signal. For example, the bass enhancement system can exploit how the human ear processes overtones and harmonics of low-frequency sounds to create the perception that non-existent (or attenuated) low-frequency sounds are being emitted from a loudspeaker. The bass enhancement system can generate harmonics of at least some low-frequency fundamental frequencies in one embodiment. Playback of at least some harmonics of a low-frequency fundamental frequency can cause a listener to perceive the playback of the low-frequency fundamental frequency. Advantageously, in certain embodiments, the bass enhancement system can generate these harmonics without performing processing-intensive pitch-detection techniques or the like to identify the fundamental frequencies.

10 Claims, 24 Drawing Sheets

Related U.S. Application Data

(60) Provisional application No. 61/580,448, filed on Dec. 27, 2011.

(51) Int. Cl.
*H03G 3/30* (2006.01)
*H03G 9/00* (2006.01)
*H03G 9/02* (2006.01)
*H04S 1/00* (2006.01)
*H04S 7/00* (2006.01)

(52) U.S. Cl.
CPC .......... *H03G 3/3089* (2013.01); *H03G 9/005* (2013.01); *H03G 9/025* (2013.01); *H04S 1/002* (2013.01); *H04S 7/307* (2013.01); *H04R 2430/01* (2013.01); *H04S 2400/03* (2013.01)

(58) Field of Classification Search
CPC .... H04R 1/40; H04R 1/403; H04R 2205/022; H04R 2205/024; H04R 2227/003; H04R 2430/01; H04R 1/227; H04R 1/2873; H04R 1/26; H04R 2201/401; H04R 2201/403; H04R 1/021; H04R 1/288; H04R 1/323; H04R 1/347; H04R 25/505; H04R 3/00; H04R 3/002; H04R 3/02
USPC ....... 381/107, 303, 101, 102, 103, 104, 106, 381/56, 57, 71.1, 73.1, 100, 105, 108, 63, 381/61, 98, 349, 118, 62, 86, 96, 1, 120, 381/182, 22, 117, 13, 150, 17, 2, 28, 322, 381/328, 330, 337, 345, 384, 386, 401, 381/54, 59, 83, 89, 93, 94.1, 94.7, 94.8, 381/99
See application file for complete search history.

(56) References Cited

U.S. PATENT DOCUMENTS

| | | | |
|---|---|---|---|
| 2,113,976 A | 4/1938 | Bango | |
| 2,315,248 A | 3/1943 | De Rosa | |
| 2,315,249 A | 3/1943 | De Rosa | |
| 2,461,344 A | 2/1949 | Olson | |
| 3,398,810 A | 8/1968 | Clark, III | |
| 3,612,211 A | 10/1971 | Clark, III | |
| 4,045,748 A | 8/1977 | Filliman | |
| 4,118,600 A | 10/1978 | Stahl | |
| 4,182,930 A | 1/1980 | Blackmer | |
| 4,481,662 A | 11/1984 | Long et al. | |
| 4,698,842 A | 10/1987 | Mackie et al. | |
| 4,748,669 A | 5/1988 | Klayman | |
| 4,790,014 A | 12/1988 | Watanabe et al. | |
| 4,817,149 A | 3/1989 | Myers | |
| 4,819,269 A | 4/1989 | Klayman | |
| 4,836,329 A | 6/1989 | Klayman | |
| 4,841,572 A | 6/1989 | Klayman | |
| 4,866,774 A | 9/1989 | Klayman | |
| 5,067,157 A | 11/1991 | Ishida et al. | |
| 5,177,329 A | 1/1993 | Klayman | |
| 5,251,260 A | 10/1993 | Gates | |
| 5,319,713 A | 6/1994 | Waller, Jr. et al. | |
| 5,333,201 A | 7/1994 | Waller, Jr. | |
| 5,359,665 A | 10/1994 | Werrbach | |
| 5,459,813 A | 10/1995 | Klayman | |
| 5,638,452 A | 6/1997 | Waller, Jr. | |
| 5,661,808 A | 8/1997 | Klayman | |
| 5,668,885 A | 9/1997 | Oda | |
| 5,737,432 A * | 4/1998 | Werrbach | H03G 11/02 381/100 |
| 5,771,295 A | 6/1998 | Waller, Jr. | |
| 5,771,296 A | 6/1998 | Unemura | |
| 5,784,468 A | 7/1998 | Klayman | |
| 5,850,453 A | 12/1998 | Klayman et al. | |
| 5,872,851 A | 2/1999 | Petroff | |
| 5,930,373 A | 7/1999 | Shashoua et al. | |
| 6,111,960 A | 8/2000 | Aarts et al. | |
| 6,285,767 B1 | 9/2001 | Klayman | |
| 7,412,220 B2 | 8/2008 | Beyer | |
| 8,005,233 B2 | 8/2011 | Smith | |
| 8,204,742 B2 * | 6/2012 | Yang | G10L 21/0208 704/209 |
| 8,315,398 B2 | 11/2012 | Katsianos | |
| 2005/0071028 A1* | 3/2005 | Yuen | H04S 3/002 700/94 |
| 2005/0245221 A1 | 11/2005 | Beyer | |
| 2005/2452211 | 11/2005 | Beyer | |
| 2008/0091416 A1* | 4/2008 | Kim | G10H 1/0091 704/200.1 |
| 2009/0052695 A1* | 2/2009 | Yamada | H04R 3/04 381/101 |
| 2009/0147963 A1 | 6/2009 | Smith | |
| 2010/0228368 A1 | 9/2010 | Oh et al. | |
| 2011/0038490 A1* | 2/2011 | Yang | H03G 5/165 381/103 |
| 2012/0259626 A1* | 10/2012 | Li | H04R 1/1083 704/226 |
| 2013/0030800 A1 | 1/2013 | Tracey et al. | |

FOREIGN PATENT DOCUMENTS

| | | |
|---|---|---|
| EP | 0 095 902 | 12/1983 |
| EP | 0 546 619 | 6/1993 |
| EP | 0 729 287 | 2/1995 |
| EP | 2 237 570 | 10/2010 |
| EP | 2278707 | 1/2011 |
| JP | 04-082500 | 3/1992 |
| JP | 04-240896 | 8/1992 |
| JP | 06-014400 | 1/1994 |
| JP | 11-509712 | 8/1999 |
| JP | 2000-505277 | 4/2000 |
| JP | 2005-318598 | 11/2005 |
| JP | 2008-103880 | 5/2008 |
| JP | 2008-135991 | 6/2008 |
| JP | 3146973 | 12/2008 |
| JP | 2009-055079 | 3/2009 |
| JP | 2009-244650 | 10/2009 |
| JP | 2011-509010 | 3/2011 |
| JP | 2011-114772 | 6/2011 |
| TW | 200301064 | 6/2003 |
| TW | 200520589 | 6/2005 |
| TW | 200731753 | 8/2007 |
| WO | WO 97/42789 | 11/1997 |
| WO | WO 98/46044 | 10/1998 |
| WO | WO 2009/030235 | 3/2009 |
| WO | WO 2011/019339 | 2/2011 |

OTHER PUBLICATIONS

Smith, Tapped Delay Line (TDL), Physical Audio Signal Processing, W3K Publishing, Center for Computer Research in Music and Acoustics (CCRMA), Stanford University, 2010.

Philips Components, "Integrated Circuits Data Handbook: Radio, audio and associated systems, Bipolar, MOS, CA3089 to TDA1510K", Oct. 7, 1987, pp. 103-110.

International Search Report and Written Opinion issued in application No. PCT/US2012/070698 on May 27, 2013.

Invitation to Pay fees and Partial Search Report issued in International application No. PCT/US2012/070698 on Mar. 20, 2013.

Office Action issued in Chinese application No. 201280064491.5 on Feb. 1, 2016.

Office Action issued in Japanese Application No. 2014-550355 on Nov. 1, 2016.

Office Action issued in European application No. 12809555.1 on Feb. 3, 2017.

Office Action issued in Chinese application No. 201280064491.5 on Apr. 1, 2017.

\* cited by examiner

BASS ENHANCEMENT SYSTEM

RELATED APPLICATION

This application is a continuation of U.S. application Ser. No. 13/720,725, filed Dec. 19, 2012, which is a nonprovisional of U.S. Provisional No. 61/580,448, filed Dec. 27, 2011. The disclosures of each of the foregoing applications are hereby incorporated by reference in their entirety.

BACKGROUND

The audio and multimedia industries have continually struggled to overcome the imperfections of reproduced sound. For example, it is often difficult to adequately reproduce low-frequency sounds such as bass. Various conventional approaches to improving the output of low-frequency sounds include the use of higher quality speakers with greater cone areas, larger magnets, larger housings, or greater cone excursion capabilities. In addition, conventional systems have attempted to reproduce low-frequency sounds with resonant chambers and horns that match the acoustic impedance of the loudspeaker to the acoustic impedance of free space surrounding the loudspeaker.

Not all audio systems, however, can simply use more expensive or more powerful speakers to reproduce low-frequency sounds. For example, some sound systems such as cell phone speakers and other consumer electronics devices rely on small loudspeakers. In addition, to conserve costs, many audio systems use less accurate loudspeakers. Such loudspeakers typically do not have the capability to properly reproduce low-frequency sounds and consequently, the sounds are typically not as robust or enjoyable as systems that more accurately reproduce low-frequency sounds.

SUMMARY

For purposes of summarizing the disclosure, certain aspects, advantages and novel features of the inventions have been described herein. It is to be understood that not necessarily all such advantages may be achieved in accordance with any particular embodiment of the inventions disclosed herein. Thus, the inventions disclosed herein may be embodied or carried out in a manner that achieves or optimizes one advantage or group of advantages as taught herein without necessarily achieving other advantages as may be taught or suggested herein.

In certain embodiments, a system for enhancing bass audio includes a bass enhancer having one or more processors. The bass enhancer can generate harmonics of one or more bass frequencies of an input audio signal based at least in part on available headroom in the input audio signal. In addition, the system may include an equalizer that can emphasize frequencies in the input audio signal including lowest reproducible frequencies of a speaker. Further, the system may include a level adjuster that can adaptively apply a gain to at least a lower band of frequencies in the input audio signal. This gain can depend on available headroom in the input audio signal.

The system of the preceding paragraph may also include any combination of the following features described in this paragraph, among others described herein. In one embodiment, the bass enhancer can generate the harmonics by at least: determining available headroom in the input audio signal, and applying a second gain to approximately half of the input audio signal. This second gain may be greater than the available headroom in the input audio signal and thereby generate harmonics of one or more fundamental bass frequencies in the input audio signal. The bass enhancer may further include a loudness filter that can emphasize the one or more bass frequencies relative to other frequencies in the input audio signal. This loudness filter can apply an inverted equal loudness curve to the input audio signal. The bass enhancer can further include an early reflections module that can filter the input audio signal with a tapped delay line. The tapped delay line can simulate reverberation reproduced by bass frequencies. The early reflections module can randomize one or both of tap delays and coefficients of the tapped delay line over time. The system may also include a combiner that can combine output of the bass enhancer with the input audio signal to produce a combiner output. The combiner can provide this combiner output to the equalizer. Further, the level adjuster can also include a high pass shelving filter that can restore balance to a band of high frequencies in the input audio signal.

In various embodiments, a method for enhancing audio can include generating, with one or more processors, harmonics of first frequencies of an input audio signal to produce an enhanced audio signal, emphasizing second frequencies in the enhanced audio signal with an equalization filter to produce an output audio signal, and supplying the output audio signal to the speaker. The second frequencies can correspond with a speaker size setting of a speaker, for example, as described below.

The method of the preceding paragraph may also include any combination of the following features described in this paragraph, among others described herein. For instance, the second frequencies can include at least some of the first frequencies. The second frequencies can also include a band of frequencies around the speaker size setting. The first frequencies can include bass frequencies. Generating the harmonics can include: determining available headroom in the input audio signal and applying a gain to approximately half of the input audio signal. The gain may be greater than the available headroom in the input audio signal, thereby generating harmonics of one or more fundamental bass frequencies in the input audio signal. The method may also include filtering the input audio signal with a tapped delay line that can simulate reverberation reproduced by bass frequencies. The method may also include randomizing one or both of tap delays and coefficients of the tapped delay line over time. The input audio signal can include a downmix of two or more input signals. The two or more input signals may include two or more of the following: a left front signal, a right front signal, a center signal, a left surround signal, and a right surround signal.

In some embodiments, non-transitory physical electronic storage can include instructions stored thereon that, when executed by one or more processors, cause the one or more processors to implement operations for enhancing bass audio. These operations can include receiving an input audio signal, determining available headroom in an input audio signal, and applying a gain to approximately half of the input audio signal to produce a partially-clipped audio signal. The gain may be greater than the available headroom in the input audio signal, thereby generating harmonics of one or more bass frequencies in the input audio signal.

The operations of the preceding paragraph may also include any combination of the following features described in this paragraph, among others described herein. For instance, the operations can further include adding the input audio signal to the partially-clipped audio signal to produce a combined audio signal, and emphasizing a band of frequencies in the combined audio signal. The band of frequencies may be associated with a speaker size setting. The operations may further include filtering the input audio signal with a tapped delay line that can simulate reverberation reproduced by bass frequencies. The operations may further include randomizing one or both of tap delays and coefficients of the tapped delay line over time. Further, the non-transitory physical electronic storage can be in combination with one or more processors, memory, and/or other computer hardware components.

Various embodiments of a system for enhancing bass audio can include one or more processors that can: access a speaker size setting input by a user, configure a plurality of bass enhancement parameters of a bass enhancement based at least partly on the speaker size setting, and apply the bass enhancement to an audio input signal using the bass enhancement parameters to enhance bass frequencies of the audio input signal.

The system of the preceding paragraph may also include any combination of the following features described in this paragraph, among others described herein. For instance, the bass enhancement parameters can include one or more of the following: a cutoff frequency, a gain, and a bandwidth. The bass enhancement parameters can also include a cutoff frequency of a low pass filter that can attenuate frequencies above the speaker size setting. The bass enhancement parameters can also include a bandwidth of an equalization filter that can emphasize a band of frequencies in the audio input signal.

BRIEF DESCRIPTION OF THE DRAWINGS

Throughout the drawings, reference numbers may be re-used to indicate correspondence between referenced elements. The drawings are provided to illustrate embodiments of the inventions described herein and not to limit the scope thereof.

DETAILED DESCRIPTION

Some audio systems attempt to compensate for poor reproduction of low-frequency sounds by amplifying the low-frequency signals prior to inputting the signals into the loudspeakers. Amplifying the low-frequency signals delivers a greater amount of energy to the loudspeakers, which in turn, drives the loudspeakers with greater forces. Such attempts to amplify the low-frequency signals, however, can result in overdriving the loudspeakers. Unfortunately, overdriving the loudspeakers can increase the background noise, introduce distracting distortions, and damage the loudspeakers.

This disclosure describes embodiments of a bass enhancement system that can provide an enhanced bass effect for speakers, including relatively small speakers. The bass enhancement system can apply one or more bass enhancements to an input audio signal. For example, in certain embodiments, the bass enhancement system can exploit how the human ear processes overtones and harmonics of low-frequency sounds to create the perception that non-existent (or attenuated) low-frequency sounds are being emitted from a loudspeaker. The bass enhancement system can generate harmonics of at least some low-frequency fundamental frequencies in one embodiment. Playback of at least some harmonics of a low-frequency fundamental frequency can cause a listener to perceive the playback of the low-frequency fundamental frequency. Advantageously, in certain embodiments, the bass enhancement system can generate these harmonics without performing processing-intensive pitch-detection techniques or the like to identify the fundamental frequencies.

The bass enhancement systems described herein can be implemented in any computing device or device with one or more processors, some examples of which include cell phones, smart phones, personal digital assistants (PDAs), tablets, mini-tablet computers, laptop computers, desktop computers, televisions, digital video recorders (DVRs), set-top boxes, media servers, audio/visual (A/V) receivers, video game systems, high-definition disc players (such as Blu-Ray® players), sound bars, and vehicle audio systems, to name a few.

I. Bass Enhancement System Overview

Figure 1:
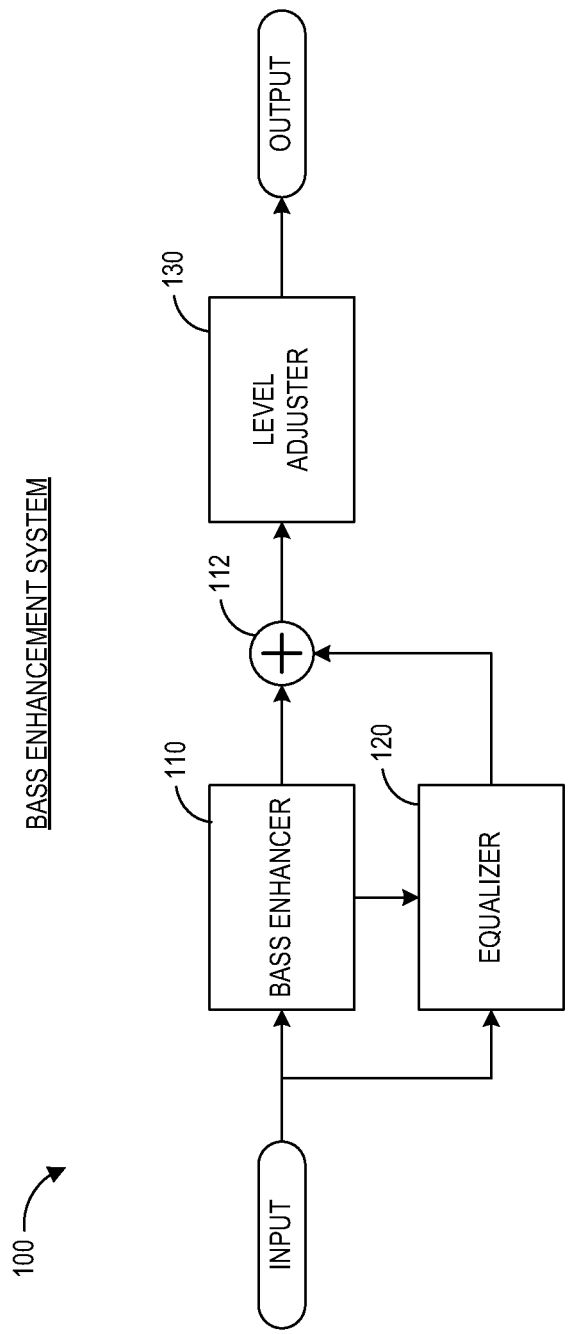
FIG. 1 illustrates an embodiment of a bass enhancement system.

FIG. 1 illustrates an example embodiment of a bass enhancement system 100. The bass enhancement system 100 can be used to enhance bass in devices having small speakers that may not be able to reproduce low frequencies or that reproduce such frequencies poorly. The bass enhancement system 100 can also be used in some embodiments to enhance a bass response reproduced by any speakers, including speakers that are able to reproduce bass frequencies.

The bass enhancement system 100 can be implemented by electronic or computing hardware, such as one or more processors. Examples of such hardware are described below. In addition, the bass enhancement system 100 can be implemented in software or firmware, in a combination of hardware and software/firmware. For example, the blocks shown in FIG. 1 and in subsequent figures can represent software, firmware, digital or analog hardware, a combination of the same, or the like.

In the depicted embodiment, the bass enhancement system 100 includes a bass enhancer 110, an equalizer 120, and a level adjuster 130. An input audio signal is received by the bass enhancement system 100 and is provided to the bass enhancer 110 and equalizer 120. This input audio signal can have one, two, or more channels of audio. For example, the input audio signal can include a pair of stereo signals, surround sound signals (e.g., 5.1, 6.1, 7.1, etc.), Circle-Surround encoded audio signals or other matrix-encoded audio, or the like. The input audio signal can be streaming audio received over a network or audio stored on a non-transitory computer-readable storage medium (such as a CD, DVD, Blu-ray disc, hard drive, or the like). For ease of illustration, however, the bass enhancement system 100 will be described primarily in the context of a single audio signal (for example, a single channel). Except where otherwise noted, it should be understood that the features described herein can be likewise implemented for multiple channels.

With continued reference to FIG. 1, the input audio signal received by the bass enhancer 110 is processed to produce a bass-enhanced audio signal. The bass enhancer 110 can apply any of a variety of bass enhancements. For example, in certain embodiments, the bass enhancer 110 can exploit how the human ear processes overtones and harmonics of low-frequency sounds to create the perception that non-existent (or attenuated) low-frequency sounds are being emitted from a loudspeaker. The bass enhancer 110 can generate harmonics of at least some low-frequency fundamental frequencies in one embodiment. Playback of at least some harmonics of a low-frequency fundamental frequency can cause a listener to perceive the playback of the low-frequency fundamental frequency. Advantageously, as will be described in greater detail below (see FIG. 2), the bass enhancer 110 can generate these harmonics without performing processing-intensive pitch-detection techniques or the like to identify the fundamental frequencies.

In addition, or instead of performing harmonic generation, in some embodiments the bass enhancer 110 generates or simulates early reflections or reverberations of bass frequencies. Such early reflections can simulate actual reflections off of a wall made by bass sounds. Playback of the early reflections can create the perception of deeper or richer bass content. Early reflections are described in greater detail below with respect to FIG. 2. Moreover, in addition to or in place of any of these techniques, the bass enhancer 110 can also increase the loudness of bass frequencies by applying inverted loudness curve filters to at least the bass frequencies.

The equalizer 120 also receives the input signal. In some embodiments, the equalizer 120 emphasizes frequencies in a region of low frequencies around a speaker's lower reproducible limits. Typical speakers (or speakers together with their enclosure) have a lower cutoff frequency, which is related to the size of the speaker, below which the speaker does not produce audible sound (or produces attenuated audio). The equalizer 120 can emphasize frequencies near this lower cutoff frequency to thereby increase the perception of bass enhancement. In some embodiments, this cutoff frequency is other than a −3 dB cutoff frequency and may be detected heuristically, as will be described in greater detail below. The signal path from input to the equalizer 120 to output of the equalizer 120, or any portion thereof, is sometimes referred to as a temporal gain path herein.

The equalizer 120 also receives an input from the bass enhancer 110 in some embodiments. The equalizer 120 can provide an output which is summed with the output of the bass enhancer 110 at summing block 112 to produce a combined bass enhanced signal. The output of the summing block 112 is provided to a level adjuster 130 in the depicted embodiment. The level adjuster 130 can adaptively adjust one or more gains applied to the combined bass enhanced signal dynamically account for changing headroom in the audio signal over time, among other factors. For example, the level adjuster 130 can dynamically compensate, at least in part, for headroom-related gain manipulations performed by the bass enhancer 110 and/or equalizer 120 by increasing and/or reducing gain of the audio signal. The level adjuster is described in greater detail below with respect to FIG. 4. It should be noted that in some embodiments, the bass enhancer 110, equalizer 120, or level adjuster 130 can be omitted from the bass enhancement system 100 while still providing at least some of the benefits of the bass enhancement system. Additional example modifications to the bass enhancement system 100 shown are described below with respect to FIGS. 6 and 7.

Figure 2:
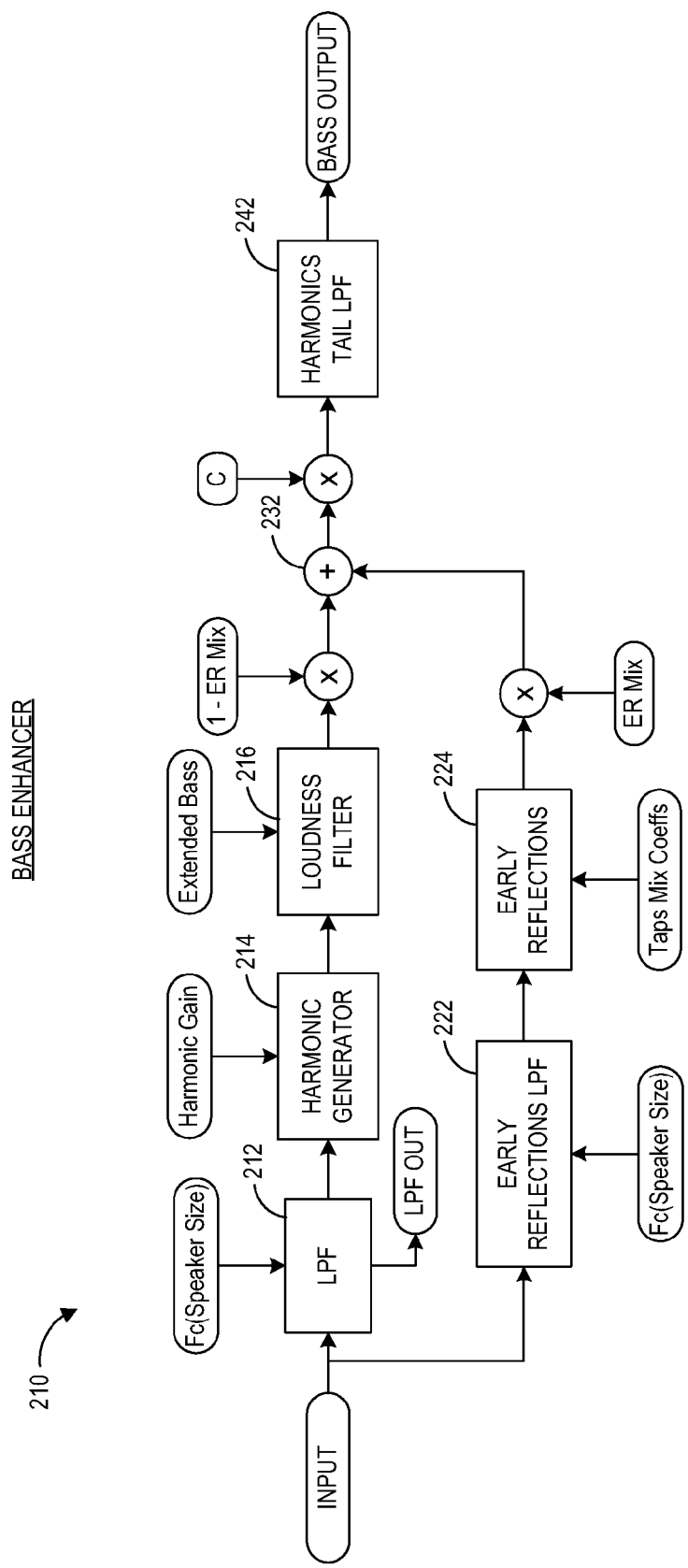
FIG. 2 illustrates an embodiment of a bass enhancer that can be implemented by the bass enhancement system of FIG. 1.

FIG. 2 illustrates a more detailed embodiment of the bass enhancer 110 described above, namely a bass enhancer 210. The bass enhancer 210 can have some or all the functionality of the bass enhancer 210 described above as well as the additional functionality shown. Any subset of the features shown in FIG. 2 may be included in an embodiment of the bass enhancer 210. Additional features may also be included in some embodiments of the bass enhancer 210.

The bass enhancer 210 receives the input audio signal described above. This input audio signal is provided to a low pass filter (LPF) 212 in the depicted embodiment. The LPF 212 can pass low frequencies and can attenuate frequencies above a cutoff frequency (Fc). This cutoff frequency can depend on the speaker size setting, which can represent the cutoff frequency of the speaker. However, in other embodiments, the cutoff frequency is user-adjustable and does not necessarily depend on speaker size. Applying a low pass filter to the input frequency can facilitate generating harmonics of low frequency signals rather than mid or high frequency signals (see block 214, described below). Harmonics in the mid- and high-frequency ranges can be perceived as unwanted noise.

In certain embodiments, the speaker size setting can be related to the actual cutoff frequency of the speaker (or the speaker's frequency response), or may actually be the true cutoff frequency of a speaker. For instance, the speaker size setting can be the frequency at which the speaker has a −3 dB or −6 dB response, or a half power response, or the like. However, the speaker size setting can also be a different frequency from the cutoff frequency of the speaker itself because the speaker size setting can be measured with the speaker installed in its enclosure (such as in a television). The frequency response of the speaker may be affected by whatever cabinet or enclosure the speaker is in, and thus the speaker size setting can take into account the effects of the speaker's enclosure in some embodiments.

The speaker size setting can be measured automatically by a processor or manually by a field engineer or other audio professional. A field engineer can heuristically establish a speaker size setting for a given speaker or set of speakers (e.g., in a television) using a process such as the following. First, the field engineer can optionally adjust the bass enhancement system 100 to provide a maximum or high-level bass enhancement to facilitate easier listening discrimination of bass enhancement differences between different speaker size settings. Thereafter, the field engineer can adjust the speaker size setting until a balance is achieved between quality of the bass enhancement and quantity of the bass enhancement. In some embodiments, the higher the speaker size setting, the more the bass enhancement volume may increase. However, a tradeoff is that the quality of the bass enhancement sound may deteriorate as the speaker size increases. Thus, the field engineer may set the speaker size until a good balance between quality and quantity is found. One option for doing so is to start with a low speaker size setting and increase the speaker size until more bass is heard by the field engineer, optionally using several different test tracks to evaluate the bass effect. The field engineer can utilize a user interface such as the user interfaces described below with respect to FIGS. 23 and 24 to tune the bass enhancement system in the television or other device that implements the bass enhancement system. In one embodiment, the field engineer can communicate bass enhancement setting changes to the device implementing the bass enhancement system using the techniques described in U.S. patent application Ser. No. 13/592,182, filed Aug. 22, 2012, titled "Audio Adjustment System," the disclosure of which is hereby incorporated by reference in its entirety.

Figure 3:
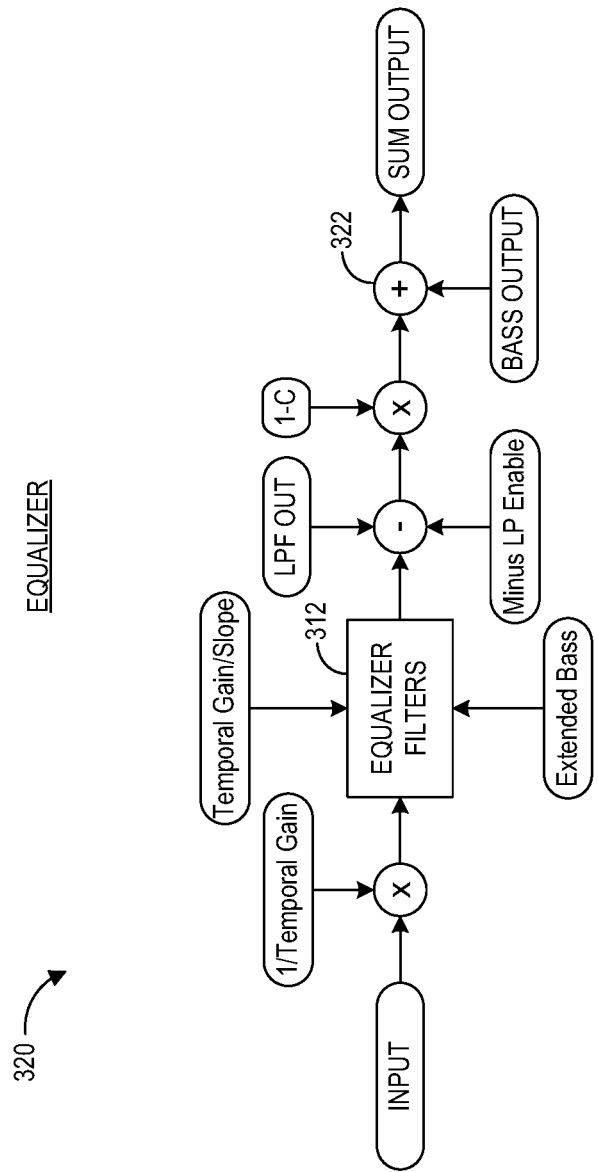
FIG. 3 illustrates an embodiment of an equalizer that can be implemented by the bass enhancement system of FIG. 1.

With continued reference to FIG. 2, in the depicted embodiment, the LPF 212 provides an output signal to a harmonic generator 214 and also as separate output signal which may optionally be used by the equalizer 120 (see FIG. 3). In certain embodiments, the harmonic generator 214 generates harmonics of at least some of the frequencies in the low-pass filtered signal. The harmonic generator 214 can advantageously generate these harmonics without using complex algorithms for detecting pitches or fundamental frequencies. In one embodiment, the harmonic generator 214 generates harmonics by clipping at least a portion of the audio signal. Unlike some algorithms that clip both positive and negative rails of the audio signal and then rectify the signal to generate harmonics, the harmonic generator 214 clips half of the signal in one embodiment. For instance, the harmonic generator 214 can clip the positive peaks in the audio signal, leaving the negative peaks untouched (or clip solely the negative peaks instead). Clipping only the positive (or only the negative) peaks can induce both odd and even harmonics, whereas clipping both positive and negative peaks can result in odd harmonics only (and rectification is often subsequently used to create the even harmonics from a fully-clipped signal). By clipping half the signal and avoiding having to subsequently rectify the signal, less processing is performed in some instances. In certain embodiments, the fundamental frequency is retained in the signal.

One advantageous approach to clipping the signal that can be used by embodiments of the harmonic generator 214 is to clip the signal based on the available headroom in the signal. For example, in one embodiment the harmonic generator 214 calculates how much headroom the signal has, applies a corresponding gain that is greater than the available headroom to the positive samples to induce clipping, which creates harmonics of at least some of the input signal frequencies. The harmonic generator 214 can then apply an inverse of this gain to the positive samples to bring the samples back to their former level (except that now they are clipped). Using available headroom to determine clipping can be advantageous because the gain used to produce clipping can be dynamically adjusted based on available headroom. Thus, the harmonic generator 214 can still induce clipping regardless of the level of the input signal, due to this dynamic analysis based on the available headroom.

The amount of the gain applied to induce clipping may be a preset amount and/or may be user-defined (e.g., by a field applications engineer, the manufacturer, an end user, or the like). In one embodiment, the value of the gain can be chosen so as to attempt to amplify the signal to about 30% greater than full scale (e.g., about 30% greater than 0 dB). For example, the harmonic generator 214 may calculate that 10 dB of headroom is available in the signal (e.g., by determining that the signal peaks at −10 dB in a given block of samples). The harmonic generator 214 can then apply about 30% more gain than the available headroom to the signal, or about 13 dB, to induce clipping. Other values for the gain can be chosen, such as 10% above full scale, 20% above full scale, or some other value. A user-adjustable control for adjusting this gain (the "harmonics clip constant") is described below with respect to FIG. 24.

One useful byproduct of this half-wave clipping approach to harmonics generation is that the harmonics generator 214 may also generate subharmonics as a side effect of the nonlinear distortion applied via clipping half the signal. These subharmonics can be generated due to intermodulation of harmonics being created from multiple tones, resulting in a richer bass sound.

Figure 5:
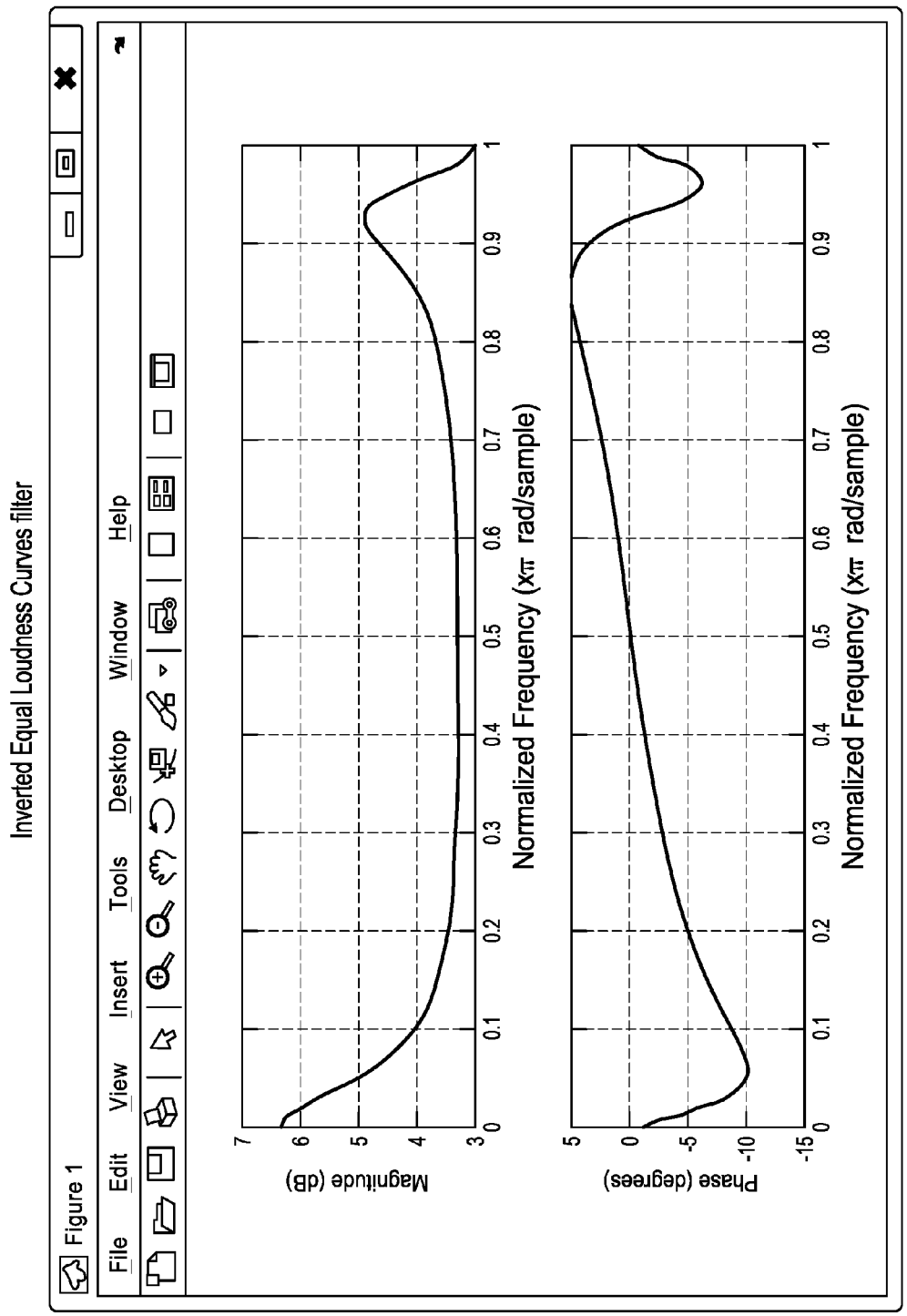
FIG. 5 illustrates example frequency response plots of a loudness filter.

The output of the harmonic generator 214 is provided to a loudness filter 216 in the depicted embodiment. The loudness filter 216 can apply an inverse equal loudness curve filter to the output of the harmonic generator 214 so as to increase the loudness of low frequencies in the audio signal. An example frequency response of such a loudness filter 216 is shown in FIG. 5. As shown in the figure, the magnitude response of the filter emphasizes lower frequencies (shown on a normalized frequency scale) relative to higher frequencies. In fact, in some embodiments, the loudness filter 216 emphasizes frequencies both below and above the speaker size setting, including the harmonics and subharmonics generated by the harmonics generator 214, as well as optionally fundamental bass frequencies. As described above, frequencies below the speaker size setting may be irreproducible or reproducible at attenuated levels by a speaker. Thus, it may be counterintuitive to emphasize these frequencies. However, doing so can obtain at least some additional bass effect in some embodiments. An extended bass control can be exposed as shown for controlling a gain of the loudness filter 216 by a user (such as a field applications engineer, the manufacturer, or end user). The extended bass control can be tuned in one embodiment to obtain a maximum or largest possible bass gain without noticeable distortion (or significant noticeable distortion) in some embodiments. The extended bass control can also be applied in the equalizer 120, as described in greater detail below with respect to FIG. 3 to further enhance bass. In alternative embodiments, the loudness filter 216 can be offset to emphasize frequencies at, around, or above (e.g., just above) the speaker size setting.

The inverse equal loudness filter can implement a weighting based on equal loudness curves or approximations thereto, such as an A-weighting curve, C-weighting curve, or other equal loudness weighting curve. In one embodiment, the equal loudness filter 216 is an inverted version of one or more of the filters described in Recommendation ITU-R BS.1770-2, "Algorithms to measure audio programme loudness and true-peak audio level," published March 2011, the disclosure of which is hereby incorporated by reference in its entirety. In another embodiment, the loudness filter 216 implements an equal loudness filter (or inverted version thereof, or weighted curve based on an equal loudness filter) from any of the example curves or filters described in U.S. Pat. No. 8,315,398, filed Dec. 19, 2008, titled "SYSTEM FOR ADJUSTING PERCEIVED LOUDNESS OF AUDIO SIGNALS," the disclosure of which is hereby incorporated by reference in its entirety. In an embodiment, the bass enhancer 210 sets the magnitude of the loudness filter 216 based on the available headroom and/or based on other characteristics of the device implementing the bass enhancement system 100, so as to avoid additional clipping.

In a separate processing chain in the depicted embodiment, the input audio signal is also provided to an early reflections low pass filter 222 and early reflections module 224. The early reflections low pass filter (LPF) 222 can have the same cutoff frequency as the LPF 212. In some embodiments, the LPF 222 could therefore be eliminated, and the output of the LPF 212 can be provided directly to the early reflections module 224. However, the LPF 222 can instead have a different cutoff frequency in some embodiments, which may or may not depend on the speaker size setting. Having a separate LPF 222 can provide flexibility in adjusting bass enhancement performance.

Figure 21:
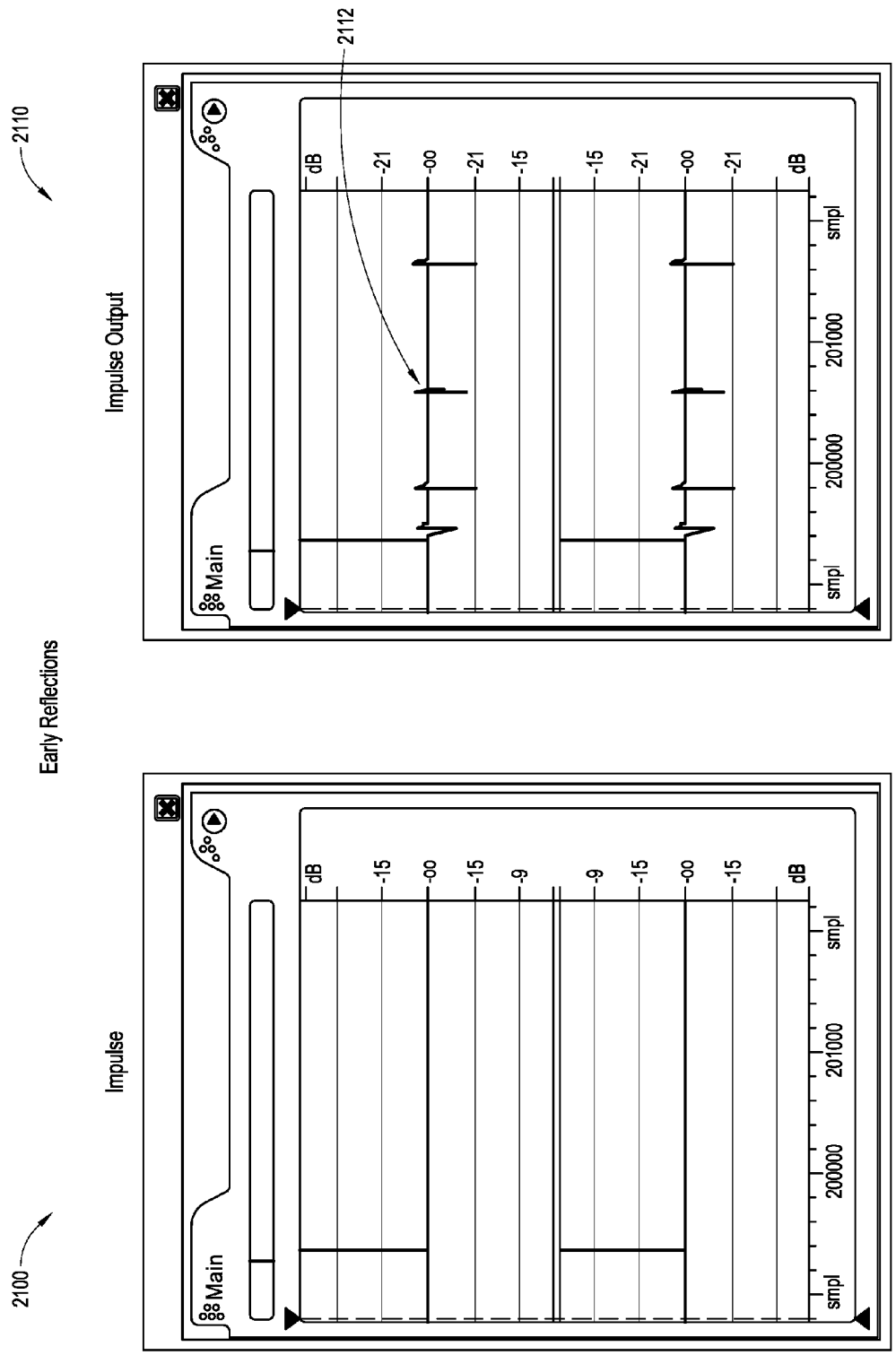
FIGS. 21A and 21B depict example time domain plots associated with an early reflections filter.

The output of the LPF 222 (or LPF 212) is provided to the early reflections module 224. In certain embodiments, the early reflections module 224 can process the signal to make the low frequency signal sound more spacious by emulating the effect of placing a speaker near a wall as opposed to in the middle of a room. This spaciousness effect can enhance the volume or perception of volume in the bass response. The early reflections module 224 can accomplish this effect by at least employing a tapped delay line to create one or more delays in the signal. For example, the tapped delay line can have one, two, three, four, or more delays. In one embodiment, four delay taps can have a particularly beneficial effect. The tap coefficients can have unity gain or some gain other than unity (such as less than unity). Time-domain plots 2100, 2110 showing an impulse function and corresponding early reflections are shown in time-domain plots of FIGS. 21A and 21B respectively. In the example plot 2110 of FIG. 21B, it should be noted that the impulse from the plot 2100 of FIG. 21A is reproduced along with four reflections 2112 in time, which are attenuated and approximately negative versions of the impulse.

Advantageously, in one embodiment the early reflections module 224 further enhances the perception of reflections by at least partially randomizing the tap points and/or tap coefficients (e.g., tap gains). In one embodiment, the tap delays range in delay from about 2 ms to about 48 ms, and the early reflections module 224 randomly adjusts these delays over time. For example, the early reflections module 224 can randomize the tap points (e.g., slowly) over time to simulate the reflection of the audio signal off of different objects in a room. The early reflections module 224 can also randomize the taps and/or coefficients differently with respect to left and right channels (and/or left and right surround channels) to simulate different arrival times at a listener's ears. The early reflections module 224 can thus simulate the occurrence of bass sound waves constructively interfering while others are destructively interfering that often occurs in a listening environment. Early reflections can also be used with a mono speaker with the same or similar benefits.

As an example, where the early reflections module 224 implements an early reflections filter having four taps, the initial tap delays can be as follows (e.g., for each channel): 2 ms (tap 1), 8.33 ms (tap 2), 25 ms (tap 3), and 48 ms (tap 4). The taps can vary randomly within different ranges. For instance, tap 1 can vary in the range of about 1 ms to about 3.125 ms, tap 2 can vary in the range of about 6.25 ms to about 10.4 ms, tap 3 can vary in the range of about 20.8 ms to about 29.1 ms, and tap 4 can vary in the range of about 45 ms to about 50 ms. The direction of randomization may also be random, so that some taps increase in delay while others decrease in delay.

While the taps may vary randomly in either positive or negative direction (or stay the same) each time a change to the taps is made, in some embodiments, some of the taps increase a random amount each time, while some of the taps decrease a random amount each time, until a limit (max or min) is reached. When the taps reach the limits of their ranges (such as the ranges described above), the next random increase or decrease can fold in the opposite direction. As an example, let us consider tap 2: at first it may be set at 8.33 ms. Then it may start increasing by random amounts (or linear amounts in one embodiment, as randomization need not be employed) until it reaches its max (in the example range above, 10.4 ms). Once it reaches its maximum, the value of the tap can fold. The folding point can be set back to the center of the tap range (about 8.33 ms) and then may start going the opposite direction until it reaches its minimum. Thus, after reaching a max of 10.4 ms, tap 2 may reset to about 8.33 ms and then continue decreasing to about 6.25 ms. Alternatively, the folding point can be set to the minimum (or maximum) and then start increasing (or decreasing) again. In addition, the 4 taps can be initialized to move in opposite directions, so some will be moving towards their high end and some will be moving towards their low end.

In one embodiment, the randomization occurs on a block-by-block basis, so that every block of samples of the audio signal, the early reflections module 224 changes the tap delay values and/or tap coefficient values. If the block size is 256 samples at 48 kHz, for example, the early reflections module 224 can randomize the tap delays about every 5.33 ms. However, the randomization frequency could be lower (e.g., every other block, every third block, etc.) or higher (e.g., randomizing multiple times per block of samples). The randomization also does not have to follow the block size. In addition, the randomization frequency itself can vary.

The output of the early reflections module 224 is provided to a multiplier block in the depicted embodiment, which multiplies the output by a gain setting "ER Mix." The ER Mix can be an early reflections mix set by a user (e.g., listener or field engineer) or system-defined, which can control the amount of early reflections combined with the output of the loudness filter 216. A corresponding 1-ER Mix gain value is applied to the output of the loudness filter 216 in the depicted embodiment, and this output is combined with the output of the gain-multiplied early reflections output at summing block 232. The ER Mix and 1-ER Mix gain values can be used to control the wet/dry mix in the output audio. More reverberation from early reflections (e.g., wet sound) can be selected with a higher ER Mix gain, while more of the less-reverberant signal (e.g., dry sound) can be selected with a lower ER Mix gain.

The multiplier blocks and summing block 232 can therefore implement a convex combination of the outputs of the loudness filter 216 and early reflections module 224, such that more gain applied to the early reflections module 224 output results in less gain applied to the loudness filter 216 output and vice versa. These gains, among others described herein, can be adjusted by a user, who may be a manufacturer or vendor of a device incorporating the bass enhancement system 110, field engineer, or an end user of such a device or software. For example, another gain "C" is applied to the output of the summing block 232. This gain forms a convex combination with the output of the equalizer 120 (see FIG. 3), described below.

An optional harmonics tail low pass filter (LPF) 242 is also provided in the depicted embodiment. The harmonics tail LPF 242 can control the amount of harmonics output by the bass enhancer 210. The harmonics tail LPF 242 can filter out higher order harmonics and may have a cutoff frequency that depends on the speaker size. In one embodiment, the harmonics tail LPF 242 has a cutoff frequency that is the same as or higher than the cutoff frequency of the speakers to which the bass enhancement system 110 is applied. In one embodiment, a default value of this cutoff frequency can be about 3 times the speaker size setting, or about 2-4 times the speaker size setting. Like many other parameters of the bass enhancement system 100, this cutoff frequency can be user-controllable or otherwise adjustable. Higher values of this cutoff frequency can add more harmonics, resulting in a richer but potentially more distorted sound. Similarly, a lower value of this cutoff frequency can result in a cleaner but less rich sound. The output of the harmonics tail LPF 242 is a bass output.

Although the bass enhancer 210 is described as implementing certain functionality, it should be understood that aspects of the bass enhancer 210 can be omitted in some embodiments. For example, the early reflections module 224 and associated low pass filter 222 may be omitted, or the loudness filter 216 may be omitted, or the harmonics tail LPF 242 may be omitted, etc. While some loss of bass enhancement may result, the bass enhancement derived from the remaining components may still be beneficial. Further, it should be noted that the early reflections module 224 and/or other components of the bass enhancer 210 can be implemented independent of the algorithm used to generate harmonics. The harmonic generator 214 could, for instance, generate harmonics using algorithms other than that described, such as by clipping the entire signal and performing rectification, using single sideband modulation, generation of harmonics in the frequency domain, other techniques, or a combination of these or other techniques. Early reflections or other aspects of the bass enhancer 210 can be combined with such harmonics generation techniques to produce a bass enhancement.

FIG. 3 illustrates an embodiment of an equalizer 320. The equalizer 320 represents a more detailed embodiment of the equalizer 120. As such, the equalizer 320 can have some or all the functionality of the equalizer 120 described above. The equalizer 320 can be implemented in hardware and/or software.

The equalizer 320 receives the input audio signal described above with respect to FIG. 1. This input audio signal is received by a multiplier block, which multiplies the input signal with a value 1/Temporal Gain to attempt to ensure that sufficient headroom is available for subsequent application of the Temporal Gain to the signal. The output of this multiplier block is provided to an equalization filter block 312, which can implement one or more equalization filters. These equalization filters 312 can be parametric equalization filters, semi-parametric equalization filters, or another type of equalization filter, or simply one or more bandpass filters. The equalization filters may generally be bandpass filters for which control over one or more parameters is enabled, such as control over center frequency, gain, bandwidth, and rolloff (or slope). The equalization filter(s) 312 can emphasize the frequency region near, around, greater than, and/or less than the speaker size setting, enhancing the lowest (or approximately lowest) reproducible frequencies of the speaker. In addition to having its ordinary meaning, the term "lowest reproducible frequencies," as used herein, can also refer to frequencies around a speaker size setting for a speaker, or frequencies in a band above the speaker size setting, which setting is discussed elsewhere herein. For example, lowest reproducible frequencies associated with a speaker can include frequencies reproducible with half power or greater by the speaker, or frequencies reproducible with −3 dB (or −6 dB) or greater power by the speaker from a peak reproducible frequency, or the like. Thus, the equalization filter(s) 312 can be bandpass filters that have a center frequency that is the speaker size setting or that is based on the speaker size setting (such as being offset from the speaker size setting by a predefined amount).

In addition to having a center frequency based on the speaker size setting, the equalization filter(s) 312 can also have a bandwidth that depends on the speaker size setting. In general, as the speaker size increases (and can reach frequencies in the vocal range), the bandwidth of the filters may be smaller so the interference with vocals or content in the mid range of frequencies is minimized or reduced. Thus, larger speakers with lower speaker size settings may have higher relative bandwidth equalization filter(s) 312, and smaller speakers with higher speaker size settings may have smaller relative bandwidth equalization filter(s) 312. Additionally, because the bandwidth of the equalization filter(s) can depend on the speaker size setting, the Q factor of the equalization filter(s) 312 can depend on the speaker size setting. Equalization filter(s) 312 having center frequencies based on higher speaker size settings can have a higher Q factor than filters(s) 312 having lower center frequencies. The higher Q factor of the higher center filter(s) 312 can accomplish the goal of reducing the greater impact to the vocal range that higher center filter(s) 312 can have relative to lower center filter(s) 312. As one example, when the speaker size is set to 80 Hz, the corresponding bandwidths can be 94 Hz and 114 Hz respectively. When the speaker size is set to 250 Hz the corresponding bandwidths can be 249 Hz and 383 Hz respectively.

In addition, the bandwidth and/or gain of the first of the two filters applied in an embodiment (or two or more or all of the equalization filter(s) 312) may also be controlled by the extended bass control described above with respect to the loudness filter 216. An increased size of the extended bass control described above, in addition to increasing the gain of the loudness filter 216, can also increase the bandwidth of one or more of the equalization filter(s) 312 to emphasize more bass and surrounding frequencies (including harmonics and/or subharmonics). Conversely, a lower extended bass setting can decrease the bandwidth and/or gain of one or more of the equalization filter(s) 312.

Figure 22:
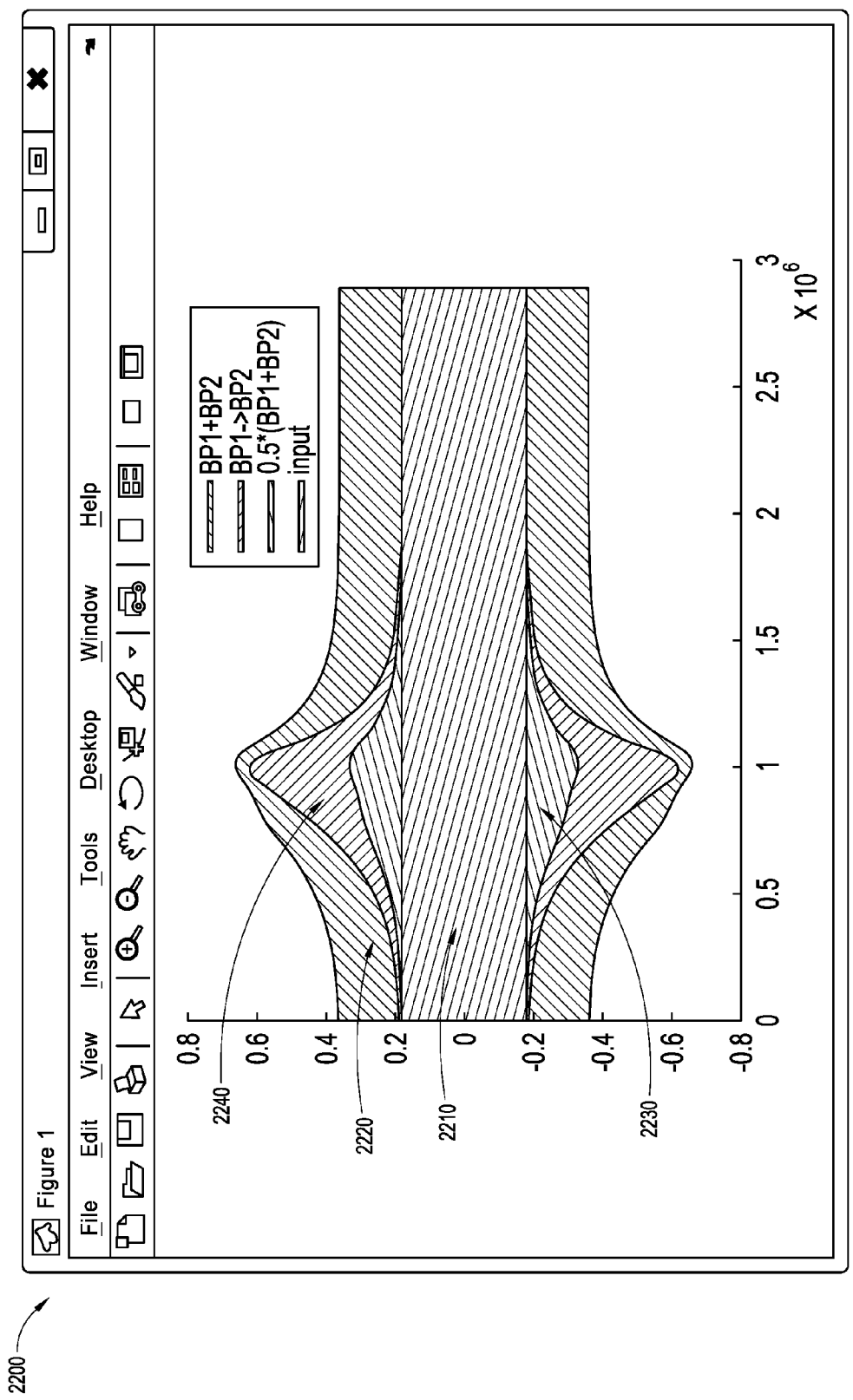
FIG. 22 depicts an example plot that contrasts parallel application of two equalization filters with series application of the same filters.

Multiple equalization filters 312 can be applied in series or parallel. Applying the filters in series, however, can result in a higher-Q filter response with a highly-localized frequency response in certain embodiments around the speaker size setting. FIG. 22 illustrates this concept. In FIG. 22, a plot 2200 is shown that contrasts parallel application of two equalization filters 312 with series application of the same filters 312. In the plot 2200, the input signal is a log sweep, represented by region 2210. If two band-pass filters are applied in parallel and then are summed together, the resulting signal can be represented by region 2220. Gain around the speaker size setting is shown in this region, near normalized frequency 1. This signal in region 2220 has gain not only around the speaker size setting but also over the whole frequency region. In order to avoid this artifact, one can scale the summed band-pass filters if they are applied in parallel. This scaling can result in the signal shown in region 2230, which has significantly lower gain around the speaker size setting than region 2220. While the gain in region 2230 can be beneficial, a higher localized gain can be achieved by applying the two equalization filters in series, resulting in the gain shown by region 2240. In the region 2240, the gain of the filter is still concentrated around the speaker size setting and the resulting gain is almost the same as in the case of the non-scaled summation of the parallel filters (region 2220).

Turning again to FIG. 3, the output of the equalization filter(s) 312 is provided to a subtraction block. Based on user input in one embodiment (LP Minus Enable), this subtraction block can optionally subtract the low-pass filtered output (see FIG. 2) from the output of the equalization filter(s) 312. Subtracting the low-pass filtered signal can reduce the original low frequency content in the equalization-filtered signal, thereby enabling the bass-enhanced low frequency content to substitute for the original low frequency content. It may be desirable to subtract the low-frequency content in some situations, such as when vocals dominate an audio signal. A preset may be exposed for a user to toggle this setting (or alternatively, apply a gain to this setting). Subsequently, the equalization-filtered signal can be multiplied by a user gain setting (1-C) and combined with the bass output of FIG. 2 at block 322. The user gain setting (1-C) represents an example convex combination with the gain setting C applied to the bass output signal in FIG. 2, and thereby adjusts the amount of bass output versus equalization output is included in the output signal.

Figure 4:
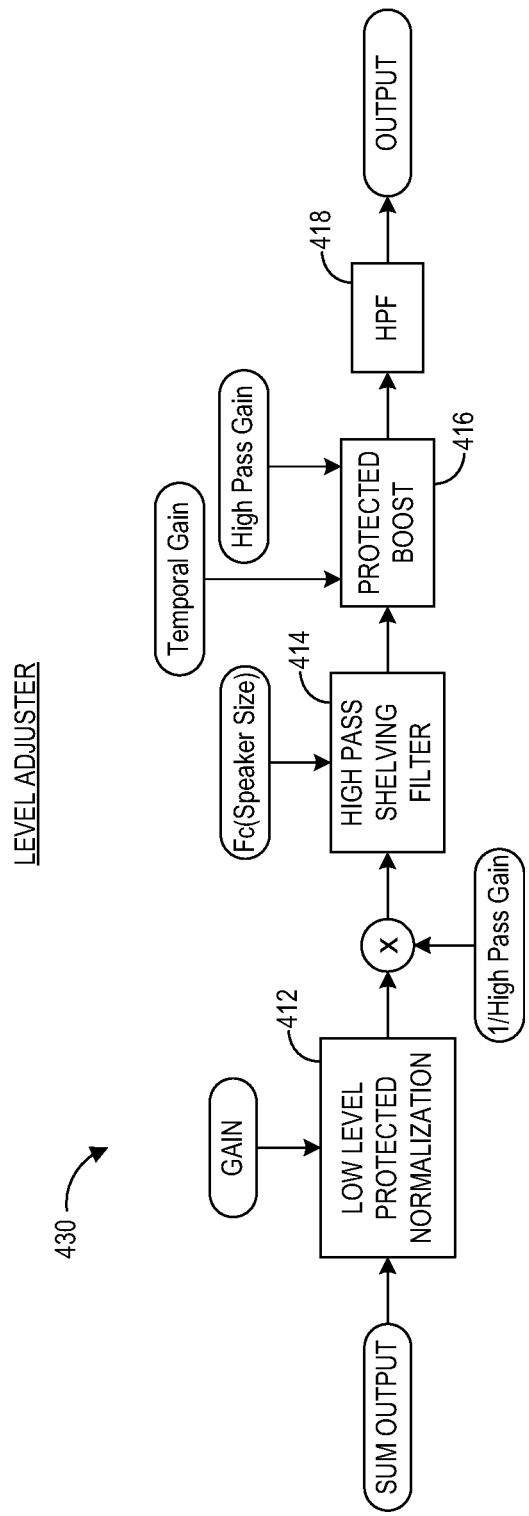
FIG. 4 illustrates an embodiment of a level adjuster that can be implemented by the bass enhancement system of FIG. 1.

FIG. 4 illustrates an embodiment of a level adjuster 430, which is a more detailed embodiment of the level adjuster 130. The level adjuster 430 can include some or all of the features of the level adjuster 130 described above and may be implemented in hardware and/or software. The level adjuster 430 can compensate, at least in part, for headroom-saving gain reductions performed by the bass enhancer 110, 210 and/or equalizer 120, 320. As such, the level adjuster 430 can restore signal levels to prior signal levels and also provide options for fine-tuning the gain of low and high frequency regions of the audio signal.

The level adjuster 430 receives the sum output of FIG. 3, which is provided to a low-level protected normalization block 412 (the "normalization block 412") in the depicted embodiment. The normalization block 412 can compute how much headroom exists in the aggregate sum signal. Based on the remaining headroom available, the normalization block 412 can emphasize the low level of the signal by applying a corresponding amount of gain to the signal. This gain, when applied to the low level but not higher level of the signal, can essentially perform dynamic range compression of the signal. The gain parameters and other dynamic range compression parameters applied can be user adjusted. For example, the level threshold of the knee of the dynamic range curve, slope of the curve, and amount of gain applied, may be user adjusted (e.g., by an end user, manufacturer of the device implementing the level adjuster 430, a field audio engineer associated with a provider of the bass enhancement system, or the like). In alternative embodiments, single band dynamic range compression is applied, such that the normalization block 412 increases a level of the entire signal by the same amount of gain based on the available headroom. More generally, the normalization block 412 can apply dynamics processing to the signal. This dynamics processing may include any combination of compression, expansion, limiting, or the like, and may or may not involve using a fixed ratio compression scheme.

The output of the normalization block 412 is provided to a multiplier in the depicted embodiment, which applies a gain value of 1/High pass gain. This gain can be applied to attempt to ensure that sufficient headroom is available in the audio signal for subsequent gain processing, described below. This gain (or a portion thereof) may be restored later, assuming that the headroom is available to do so. The output of this multiplier is provided to a high pass shelving filter 414 in the depicted embodiment. The high pass shelving filter 414 can optionally be applied (with a user-adjustable gain) to boost high frequencies so as to restore at least some balance to higher frequencies should the low frequencies predominate over much. The high pass shelving filter 414 may add gain but does not remove gain in the low frequencies in one embodiment. The cutoff frequency of the shelving filter 414 may again be a function of the speaker size setting, or instead may be a function of where the low-pass filter cutoff frequency was set at above (if different from the speaker size setting) or a different setting.

The output of the shelving filter 414 is supplied to a protected boost block 416 in the depicted embodiment. The protected boost block 416 can restore the temporal gain and high pass gain removed above by inverse multiplication in FIG. 3 and in the 1/High pass gain multiplier. However, the protected boost 416 restores this gain in one embodiment based on how much headroom is available. If enough headroom is available, the protected boost 416 may restore most or all of this gain, whereas if little or no headroom is available, the protected boost 416 may reduce the amount of gain applied. In one embodiment, the protected boost block 416 implements a look-ahead delay line to determine a certain number of samples or blocks ahead what headroom is available. Based on the available headroom, the protected boost block 416 can determine whether applying the temporal and/or high pass gain will induce clipping in the audio signal. If so, then the protected boost block 416 can apply a reduced gain or no gain to the signal. Otherwise, the protected boost block 416 may apply the entire gain to the signal. The protected boost block 416 can compute one or more gains for each block of samples (or to individual samples) in the signal. In some embodiments, the protected boost block 416 employs a smoothing algorithm to precomputed gains from block to block (or sample to sample) to enable the gains to transition smoothly (e.g., from block to block or sample to sample) to avoid undesirable sound artifacts from rapid gain changes.

The output of the protected boost block 416 is provided to a high pass filter (HPF) 418, which can optionally remove some low frequency gain to protect the life of the speaker(s). Too much gain applied to the low (or high) end of a speaker's reproducible frequency range can damage a speaker. Thus, to avoid or attempt to avoid this possibility, the high pass filter 418 can reduce the gain applied and may be user selectable should a user desire or feel that this gain reduction would be beneficial. The high pass filter 418 can, for example, remove or attenuate frequencies below the speaker size setting. The speaker size setting can therefore be the cutoff frequency or approximately the cutoff frequency of the high pass filter 418. Further, in one embodiment, the high pass filter 418 can have a steep rolloff characteristic by being a higher order filter, such as a fourth order filter. The order of the filter may also be other than fourth order (including lower or higher orders).

Figure 6:
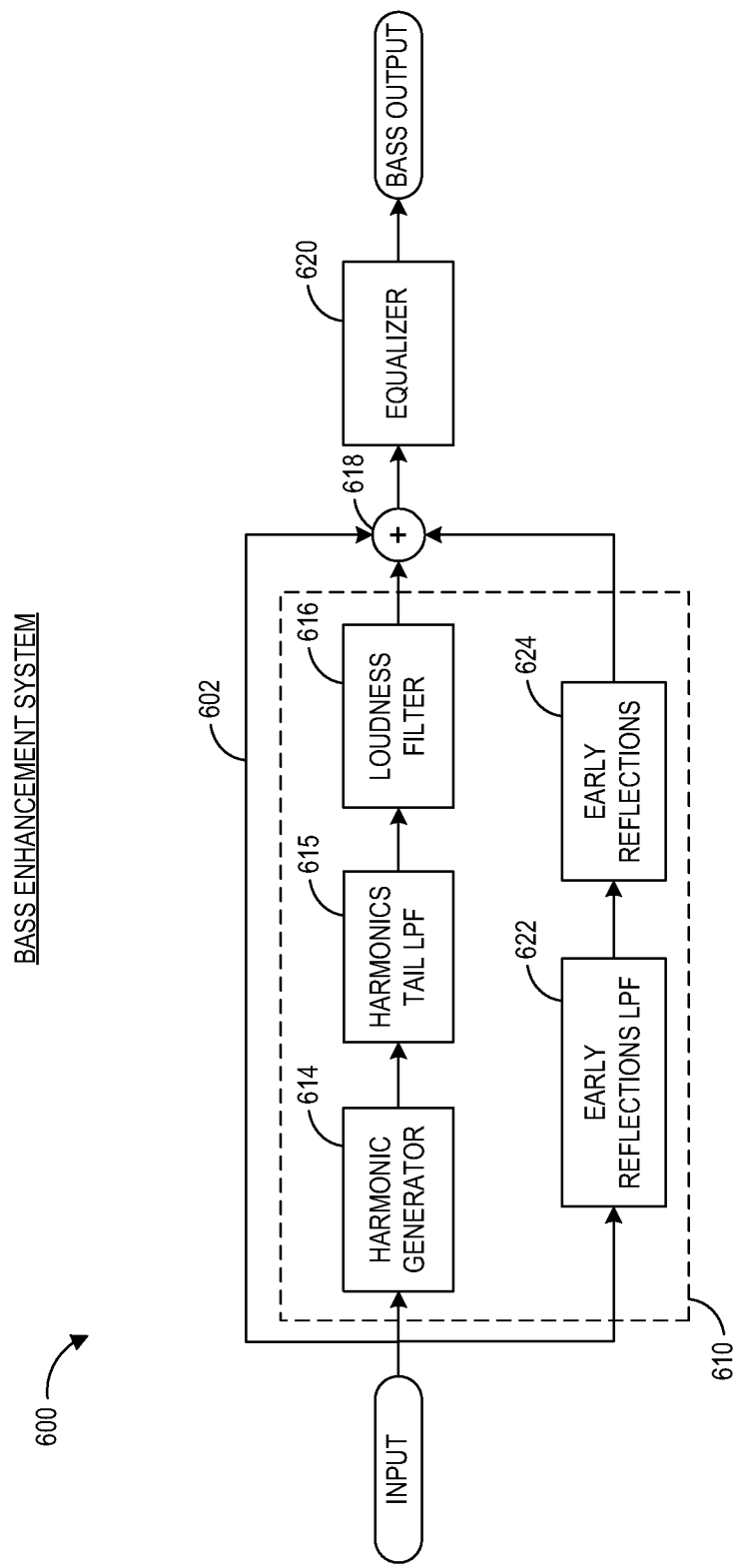
FIG. 6 illustrates another embodiment of a bass enhancement system.

FIG. 6 illustrates another embodiment of a bass enhancement system 600. The bass enhancement system 600 includes many features of the bass enhancement system described above with respect to FIGS. 1-5. For example, the bass enhancement system includes a bass enhancer 610 and equalizer 620. Although the level adjuster 130 is omitted from the bass enhancement system 600, it may be included in other embodiments. In addition, for ease of illustration, some aspects of the bass enhancement system 600 have been simplified. For example, speaker-size dependent cutoff frequencies, early reflections mix coefficients, and the like are omitted. However, these and other features of the bass enhancement system 100 may be implemented (or not implemented) in the bass enhancement system 600 in various embodiments.

Advantageously, in certain embodiments, the bass enhancement system 600 can use fewer computing resources than the bass enhancement system 100. These computing resource savings can come in part because the bass enhancement system combines the input signal (via signal path 602) with the output of the bass enhancer 610 and provides this combined output to the equalizer 620. In addition, one of the low pass filters (the LPF 212) of the bass enhancer 210 is omitted in the bass enhancer 610, reducing usage of computing resources. Instead, the bass enhancer 610 includes a harmonic generator 614, harmonics tail LPF 615, and loudness filter 616, as well as the early reflections LPF 622 and early reflections module 624. Each of these components can have all of the functionality described above with respect to FIG. 2.

In other embodiments, to further reduce computing resource usage, the early reflections LPF 622 and early reflections module 624 may be omitted. In another embodiment, the output of the early reflections LPF 622 can be provided to the harmonic generator 614 instead of the input signal being provided to the harmonic generator 614, in addition to providing this output to the early reflections module 624.

Figure 7:
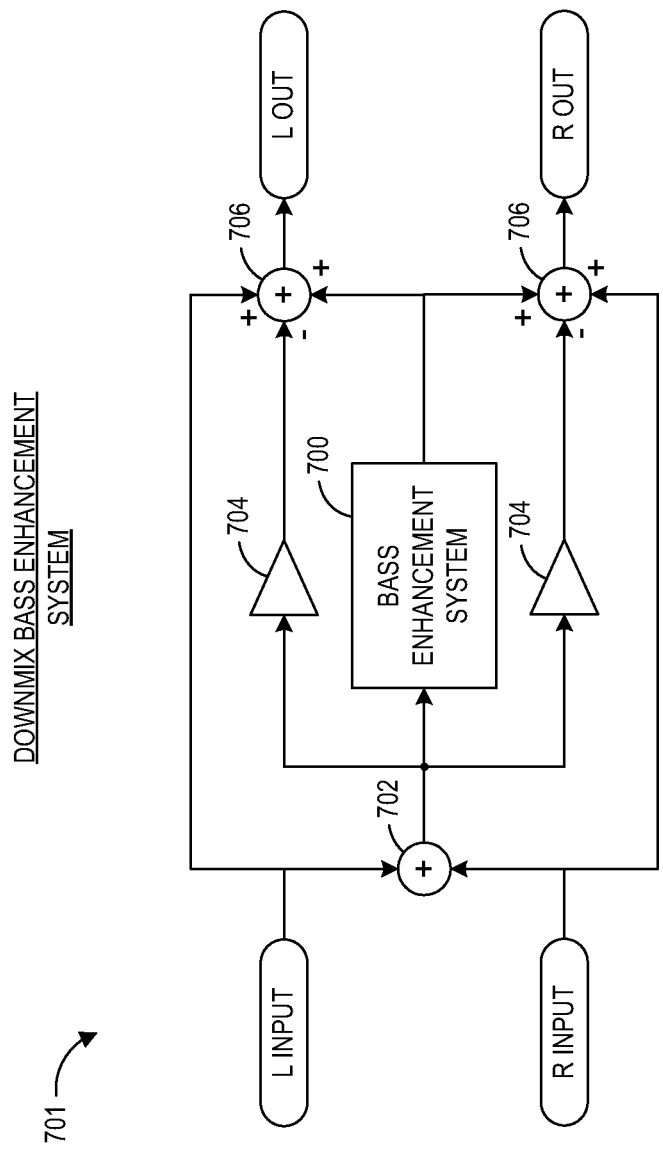
FIG. 7 illustrates an embodiment of a downmix bass enhancement system.

FIG. 7 illustrates an embodiment of a downmix bass enhancement system 701. The downmix bass enhancement system 701 can provide additional processing resource savings for multi-channel environments by applying the bass enhancement features described above to a downmix of two or more audio signals rather than to the individual audio signals. In the depicted embodiment, the system 701 is shown implementing a two-channel configuration, although the system 701 can also be used for more than two channels (as will be described below).

The system 701 includes a bass enhancement system 700 that can implement either the bass enhancement system 100 or 600. Left and right input signals are received by the system 701 and are provided to a combiner or summer block 702. The output of the summer block 702 is an L+R (left plus right) signal, which is provided to the bass enhancement system 700. The bass enhancement system 700 performs some or all of the bass processing described above with respect to the system 100 and/or 600 and provides an output to two summer blocks 706. Likewise, the left and right input signals are each supplied to respective summer blocks 706. Moreover, the left and right input signals are each provided to a respective gain block 704, which each supplies an output to the respective summer block 706. In an embodiment, the output of the summer blocks 706 is as follows:

$$L \text{ output} = L \text{ input} + (L+R)_{processed} - \alpha*(L \text{ input} + R \text{ input})$$

$$R \text{ output} = R \text{ input} + (L+R)_{processed} - \beta*(L \text{ input} + R \text{ input}),$$

where $(L+R)_{processed}$ is the output of the bass enhancement system 700 and $\alpha, \beta$ are the values of each of the gain blocks 704. In an embodiment, the value of $\alpha$ and $\beta$ is 0.5. The constants $\alpha$ and $\beta$ can be the same or different in different embodiments.

In scenarios with more than two channels, each channel can be combined and processed as a combined signal by the bass enhancement system 700. Alternatively, some channels may be processed collectively while others are processed individually or not at all. For instance, if the inputs include 5.1 surround sound inputs (e.g., left front, center, right front, left surround, right surround, subwoofer), then the bass enhancement system 700 could enhance the combined left front and right front signals and enhance the combined left surround and right surround signals. Alternatively, the bass enhancement system 700 could enhance each of the left front and right front signals separately while also enhancing the combined left and right surround signals. In yet another configuration, the bass enhancement system 700 could enhance the combined left front, center, right front, and left and right surround signals while separately enhancing the subwoofer signal. Many other variations are also possible.

II. Example Plots

Figure 8:
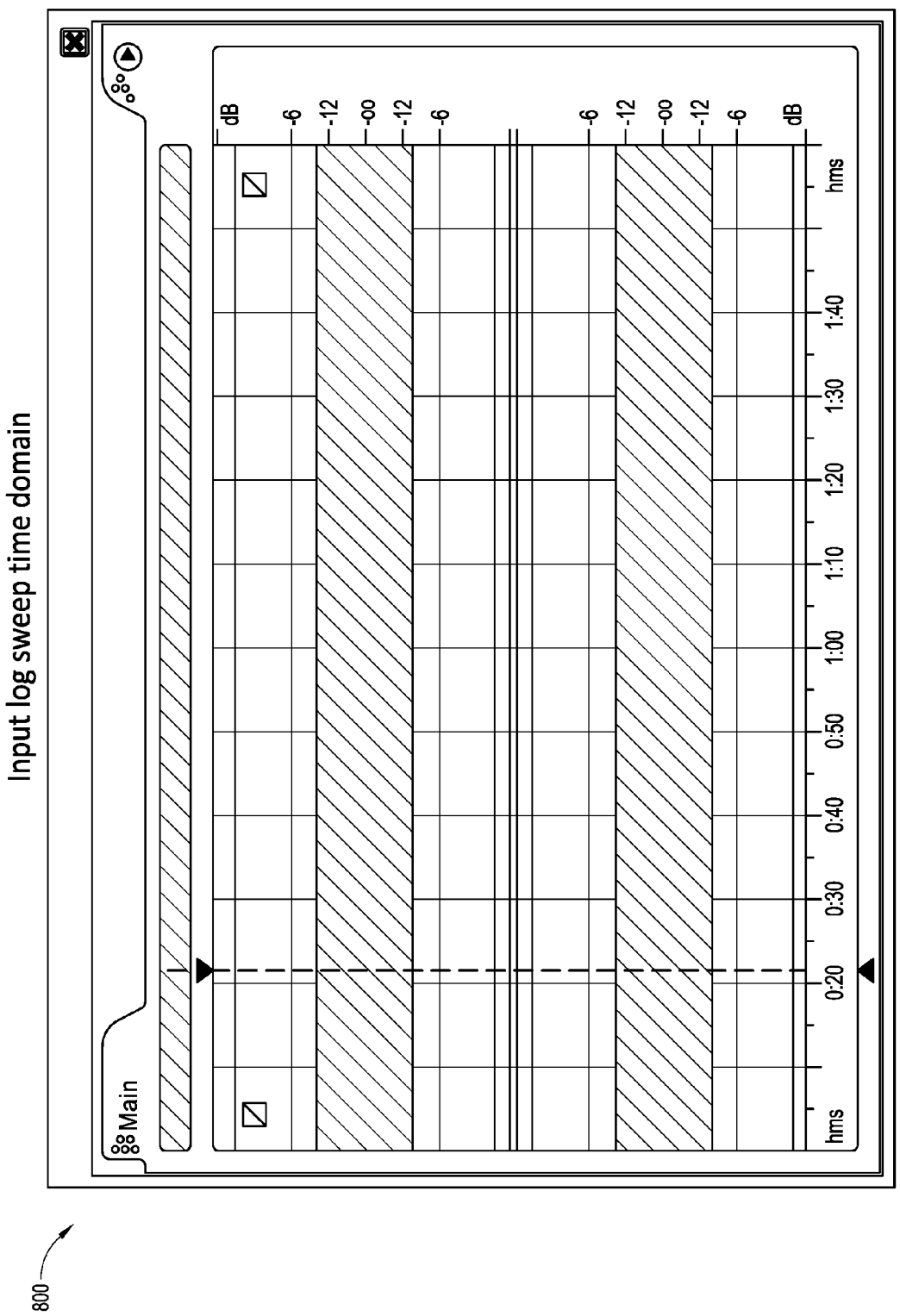
FIGS. 8 through 19 depict example output plots associated with embodiments of any of the bass enhancement systems described herein.
Figure 9:
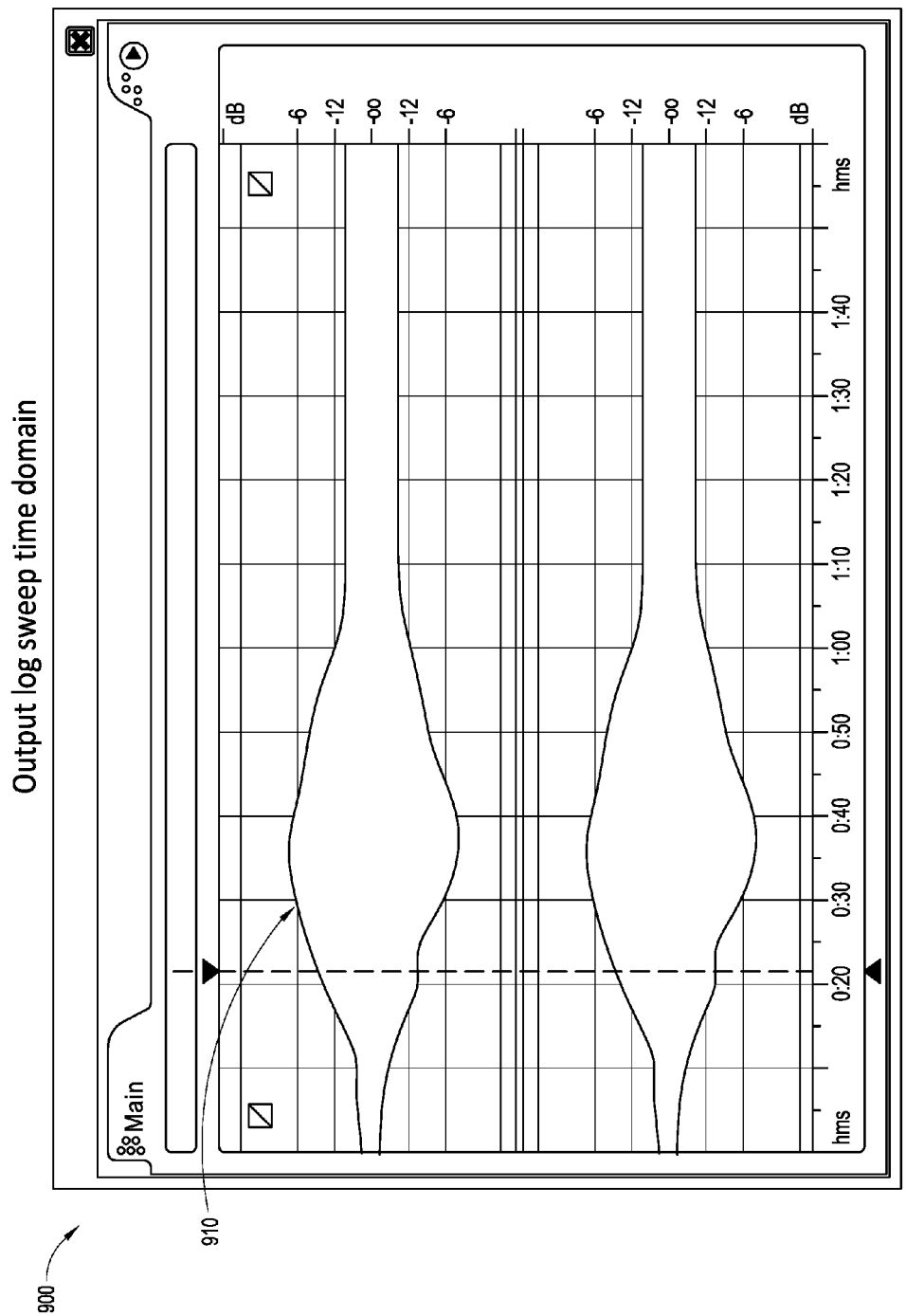
Figure 10:
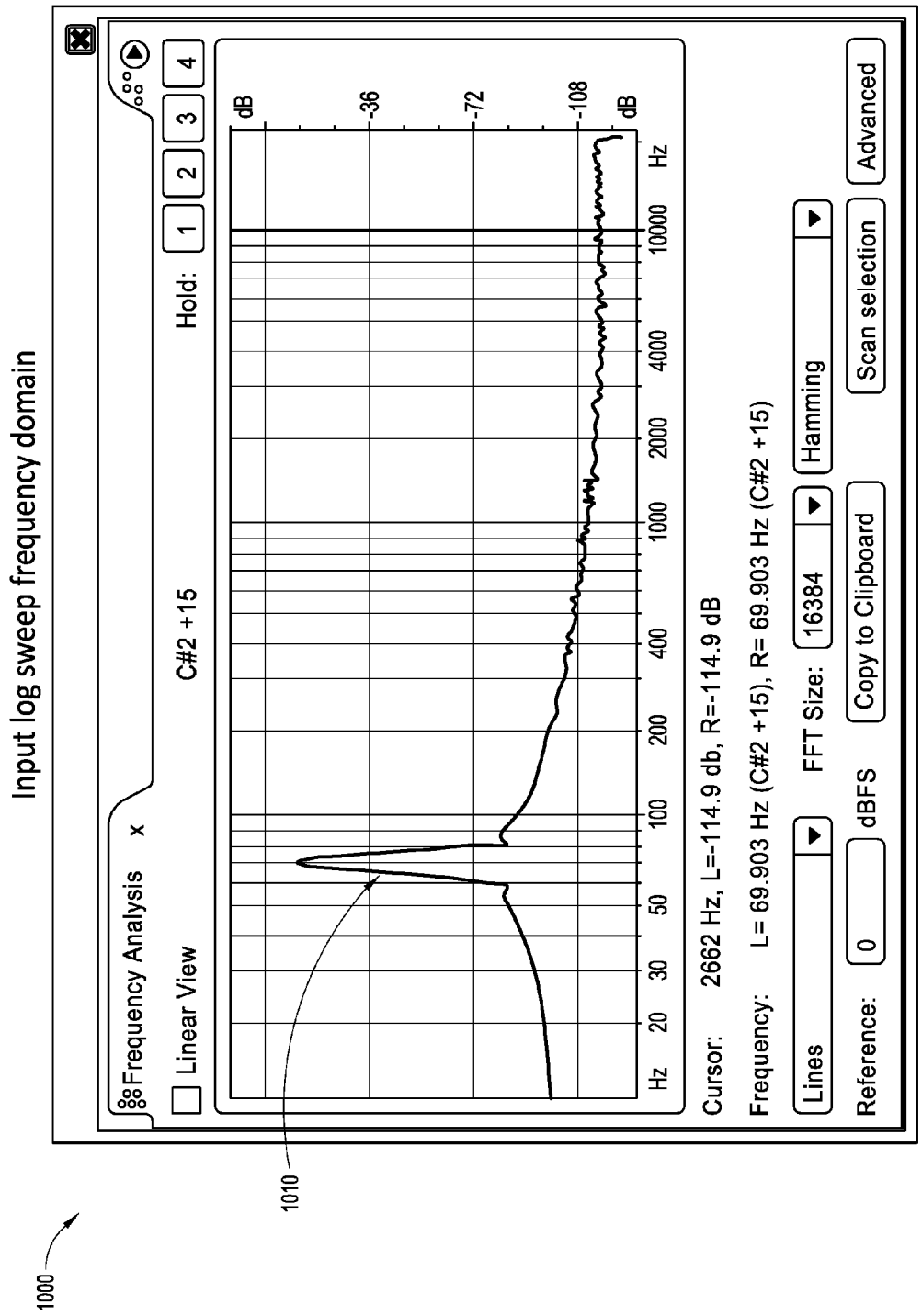
Figure 11:
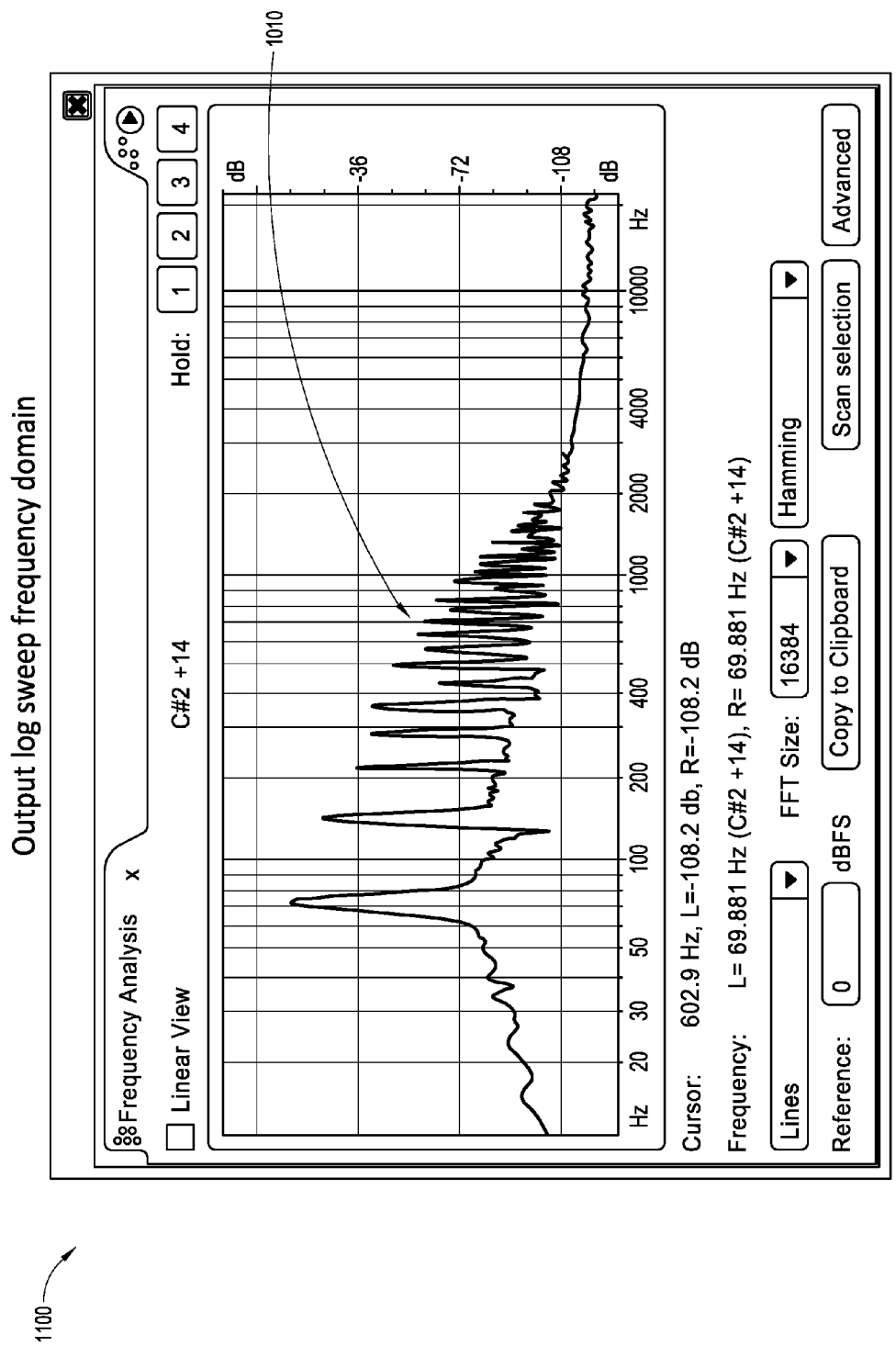

In addition to the plots described above, FIGS. 8 through 19 illustrate additional example plots that depict sweep inputs and outputs of the bass enhancement systems described above. For instance, FIG. 8 depicts an example two-channel input log sweep plot 800 in the time domain that can be supplied to the bass enhancement system. FIG. 9 depicts an example two-channel output log sweep 900 in the time domain, which corresponds to the input log sweep plot 800 after processing by the bass enhancement system. As this is an output logarithmic sweep, the frequency changes as time progresses and only one frequency is represented at any given point in time. The low frequencies (e.g., around the speaker size setting) are enhanced whereas the rest of the signal remains unaffected or less affected. FIG. 10 depicts another input log sweep plot 1000 but in the frequency domain, for which a corresponding output log sweep plot 1100 in the frequency domain is shown in FIG. 11. In the input log sweep plot 1000 of FIG. 10, a pronounced fundamental bass frequency 1010 is shown. In the output log sweep plot 1100 of FIG. 11, harmonics 1110 of the fundamental bass frequency 1010 are shown, which have been generated by the bass enhancement system.

Figure 12:
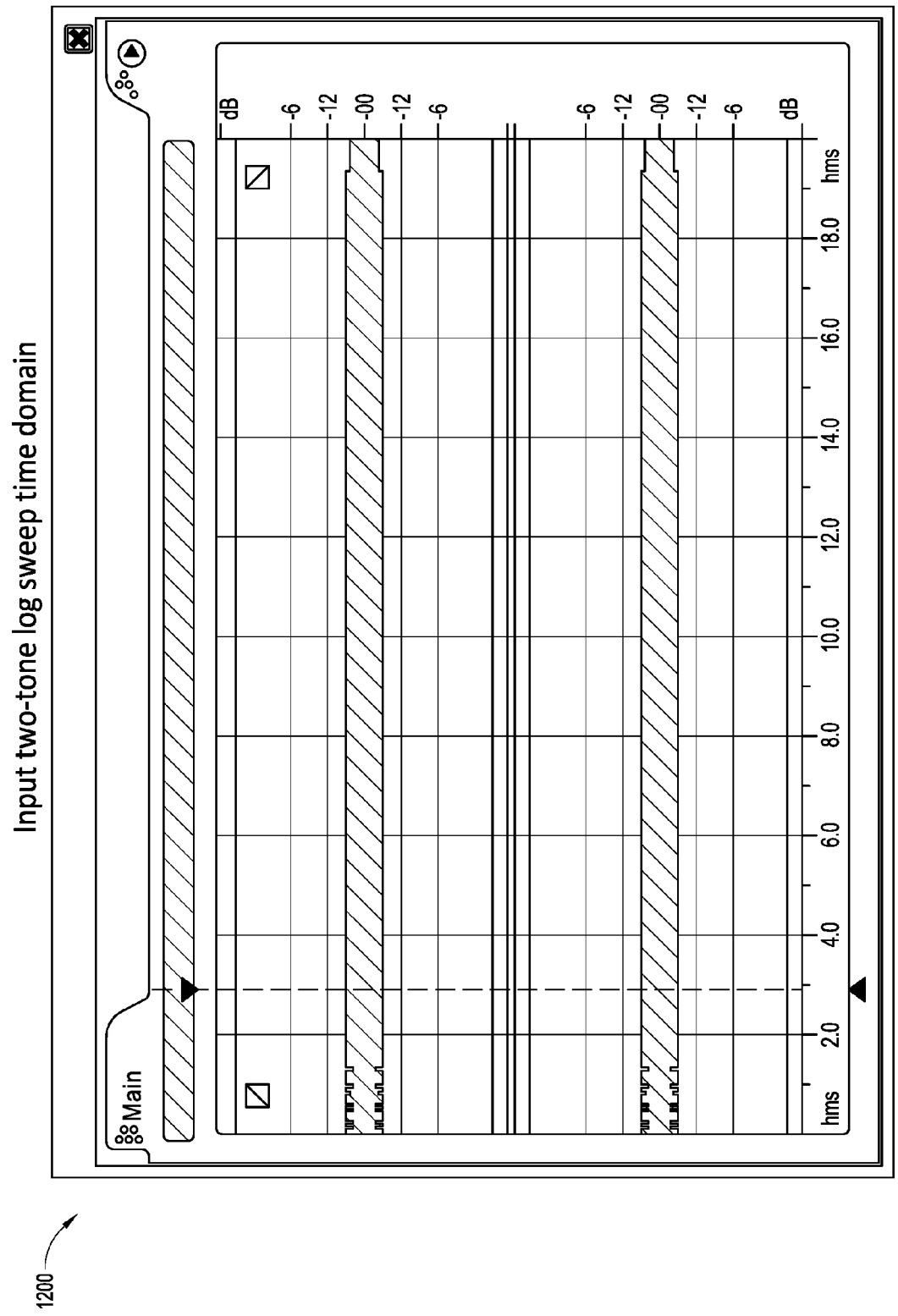
Figure 13:
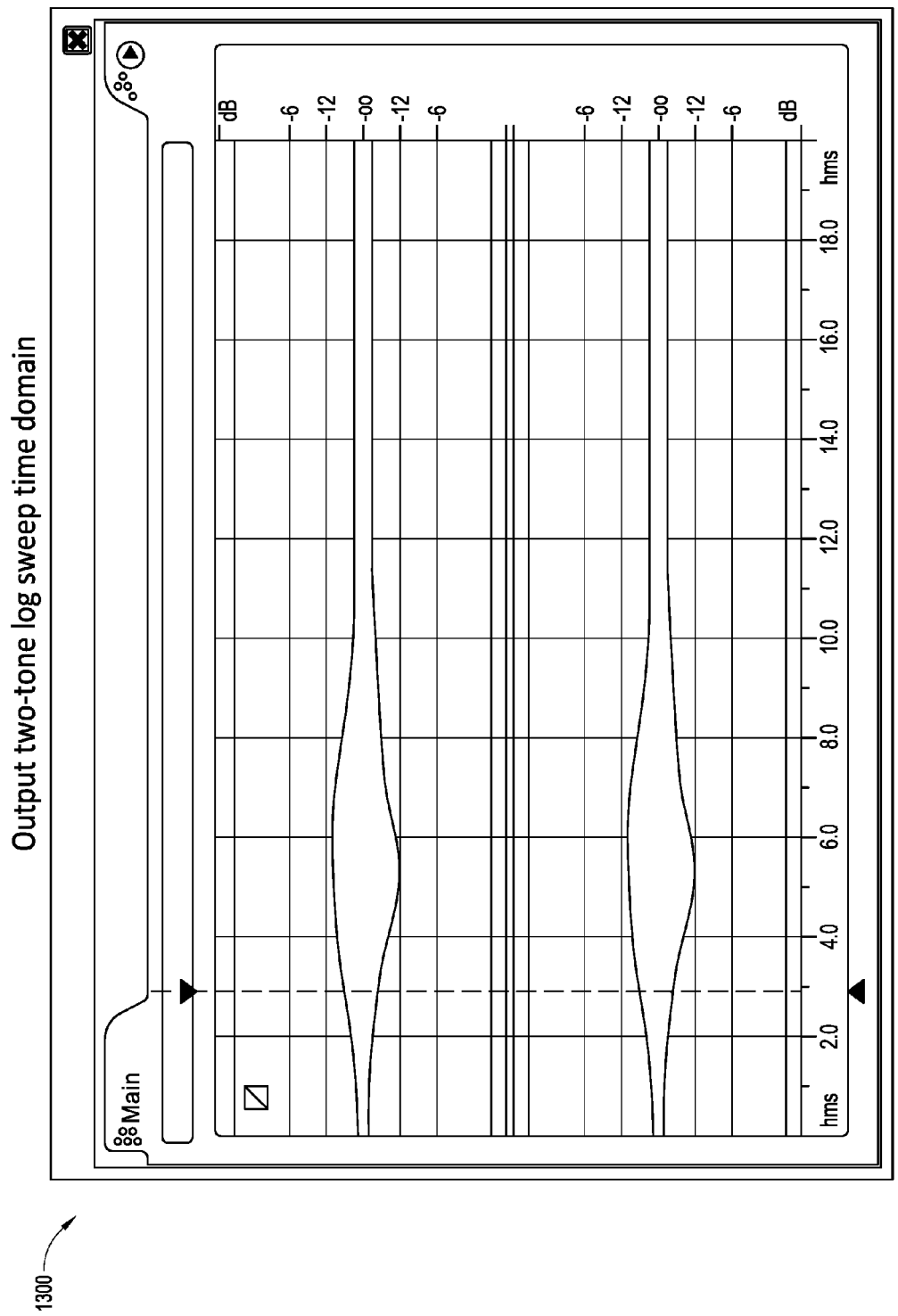
Figure 14:
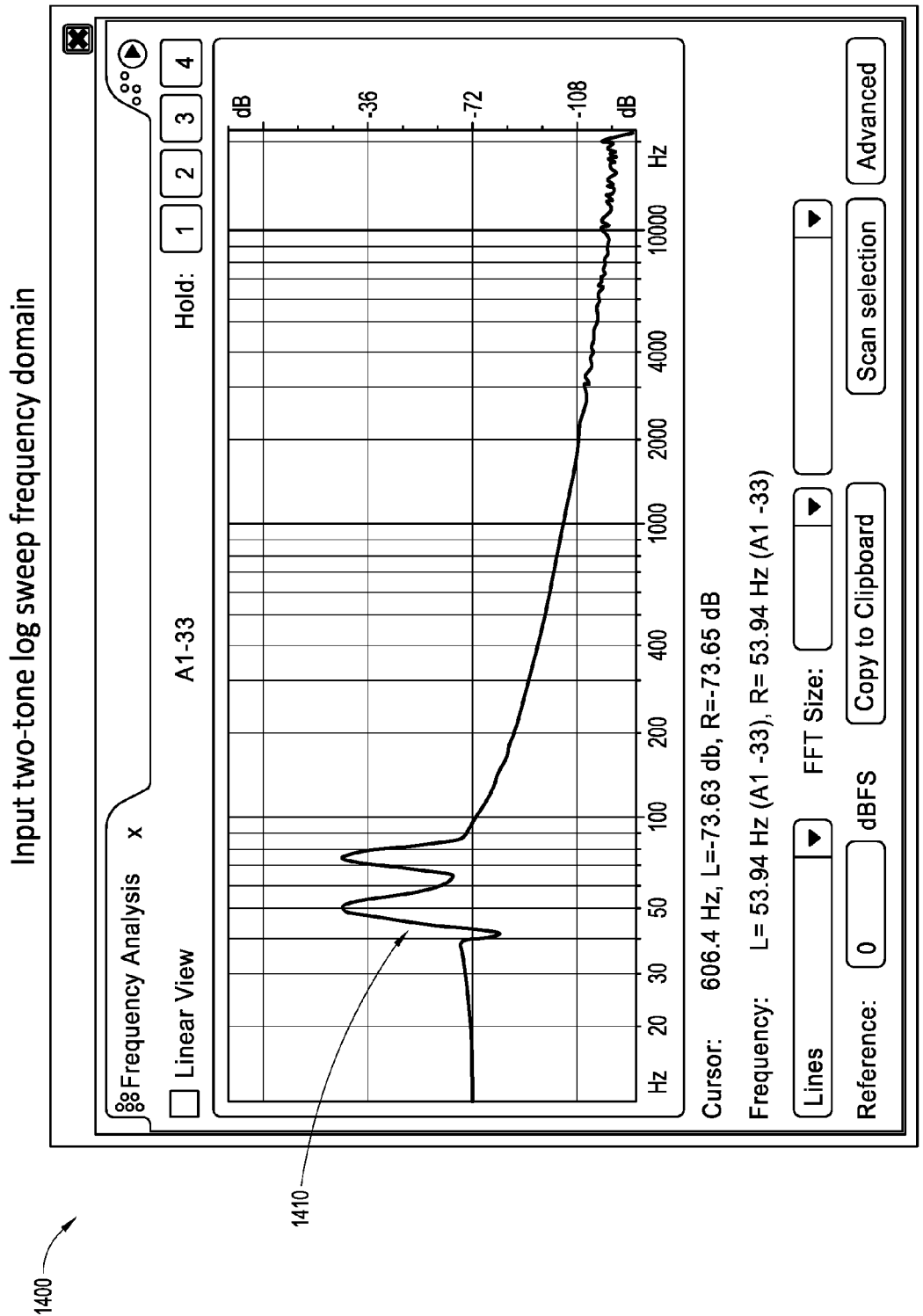
Figure 15:
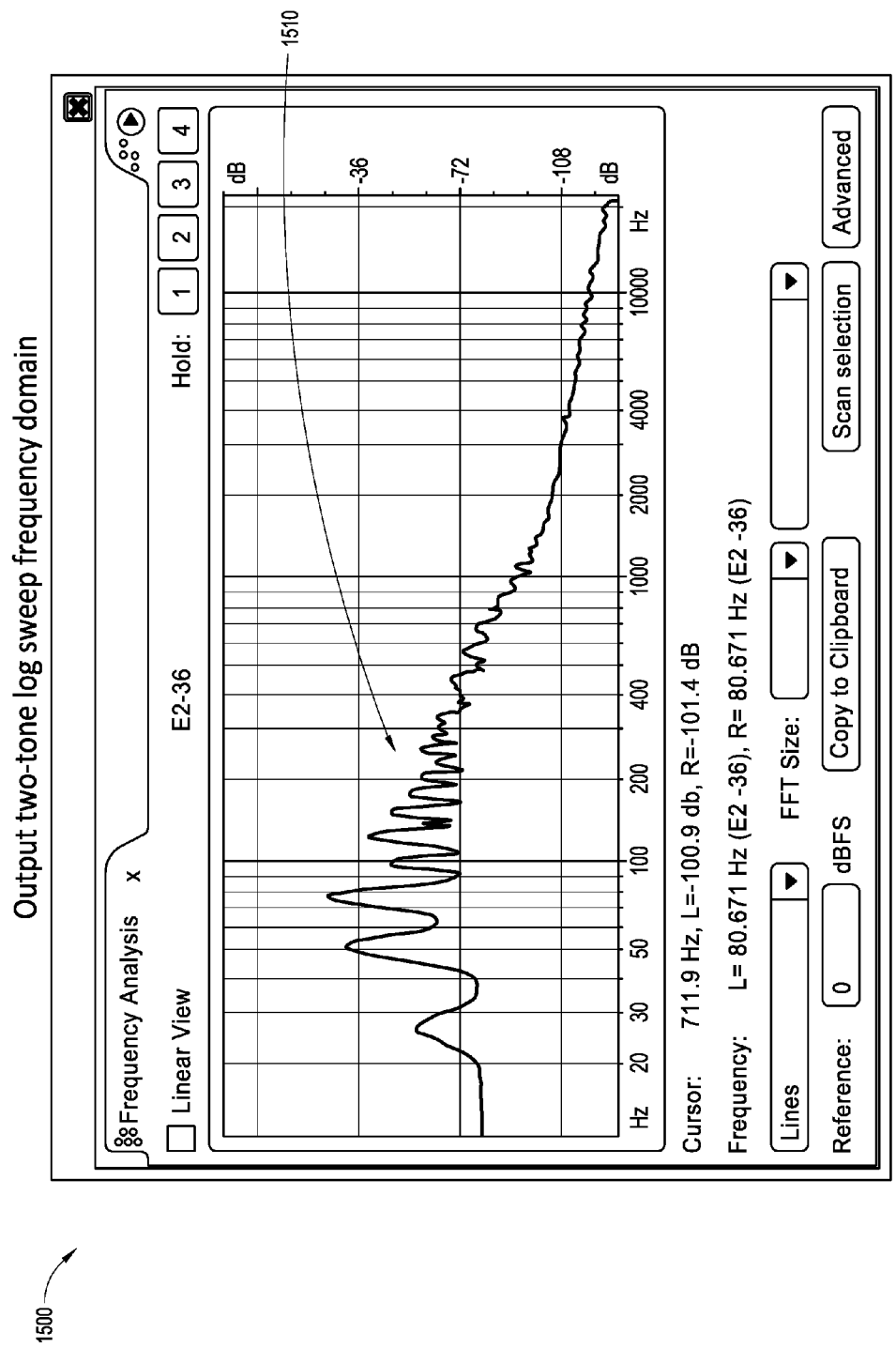
Figure 16:
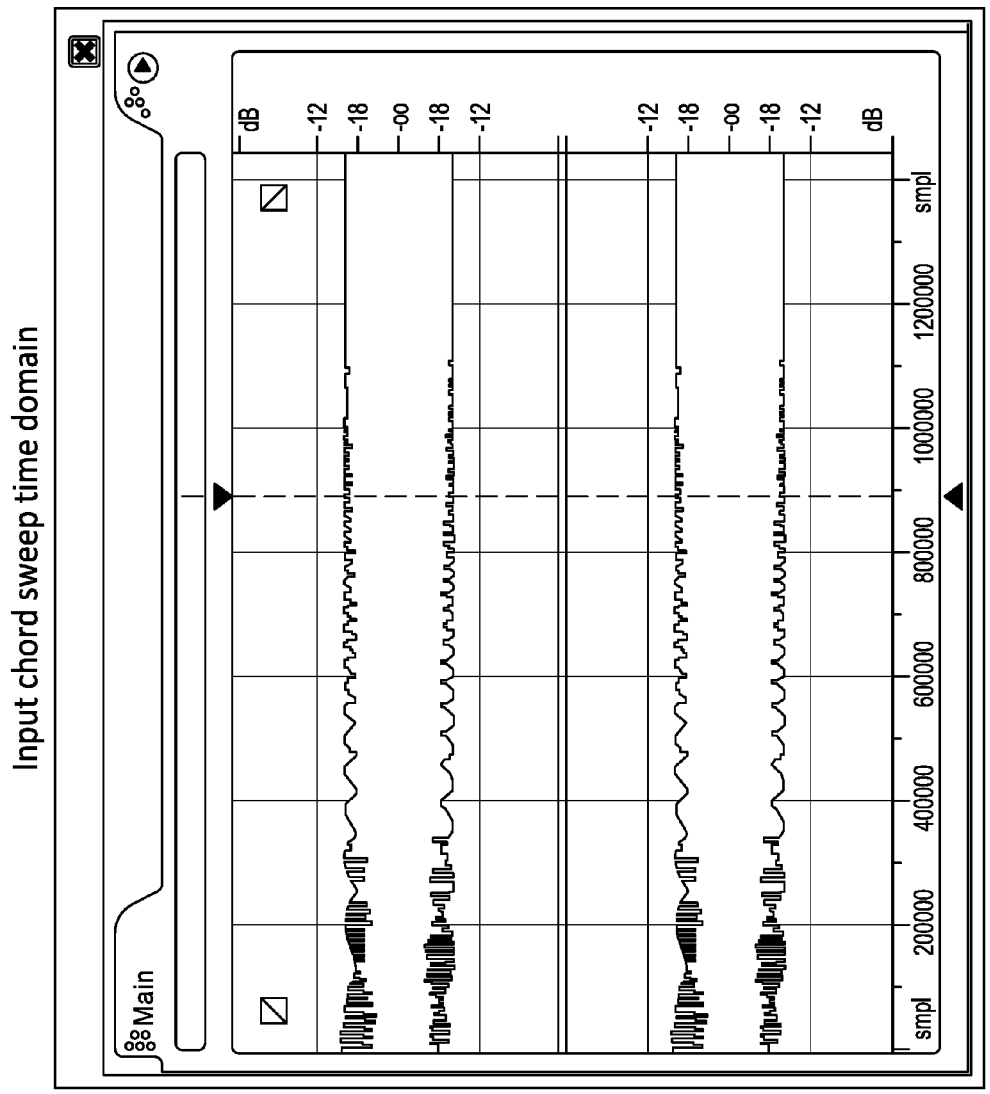
Figure 17:
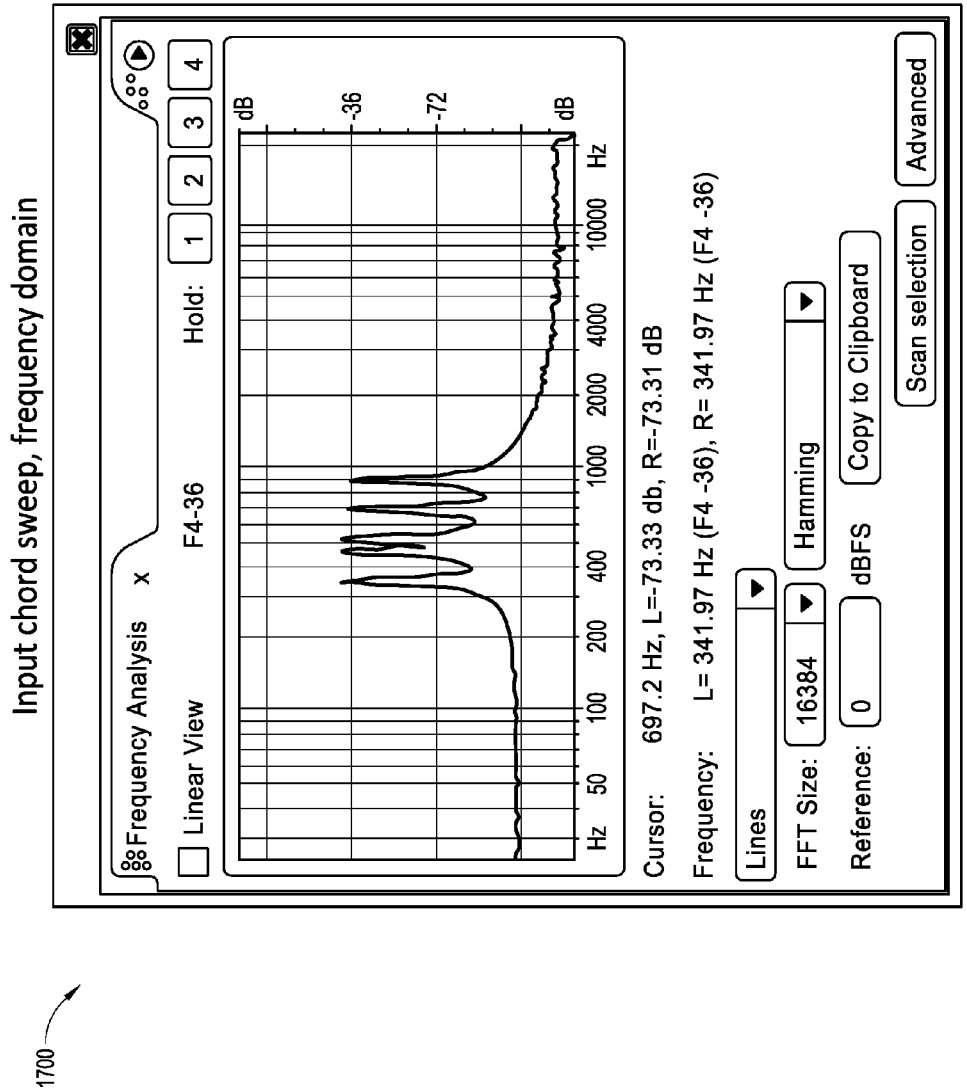
Figure 18:
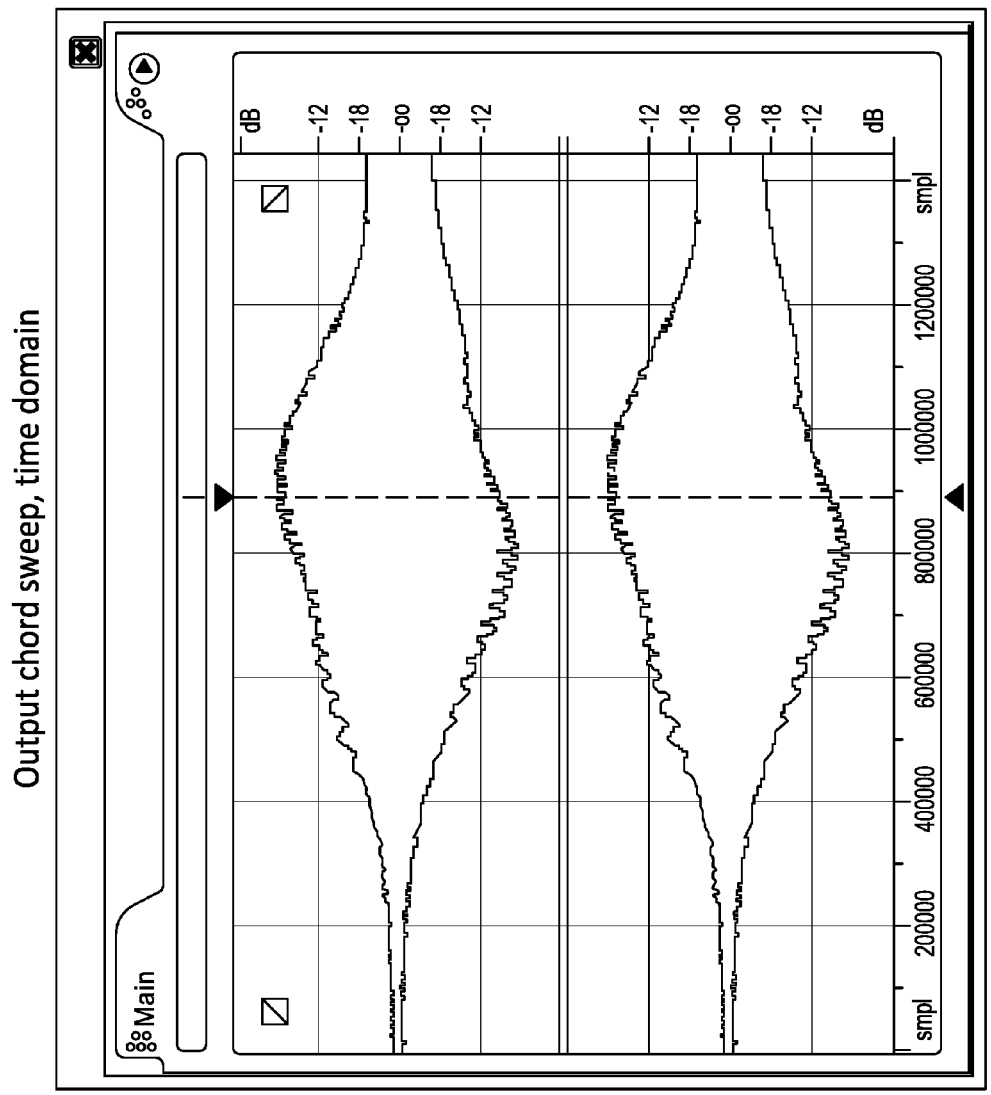
Figure 19:
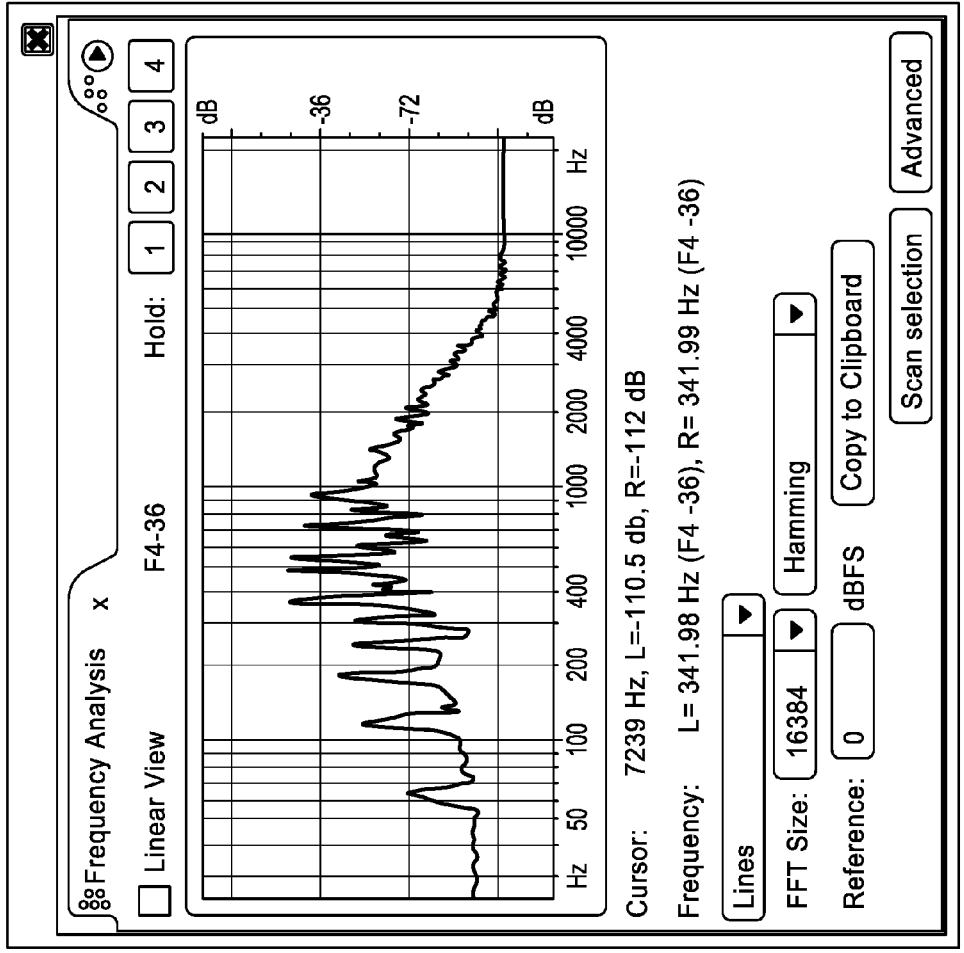

FIG. 12 depicts an input two-tone log sweep plot 1200 in the time domain, and FIG. 13 depicts the corresponding two-tone log sweep output plot 1300 in the time domain, after processing by the bass enhancement system. Like the plot 900, the plot 1300 shows how low frequencies are enhanced. FIG. 14 depicts a plot 1400 of the input two-tone log sweep in the frequency domain, showing two fundamental frequencies 1410. Harmonics 1510 of these frequencies are shown in an output two-tone log frequency sweep plot 1500 in FIG. 15. FIG. 16 illustrates a plot 1600 of an input chord sweep in the time domain, with FIG. 17 depicting a plot 1700 of the corresponding frequency domain, showing multiple fundamentals corresponding to the chord sweep. FIG. 18 depicts a plot 1800 of the time domain output of the bass enhancement system responsive to the chord sweep of FIG. 16, with enhanced output. FIG. 19 depicts the frequency domain output plot 1900 that corresponds to the time domain output plot 1800 of FIG. 18.

Figure 20:
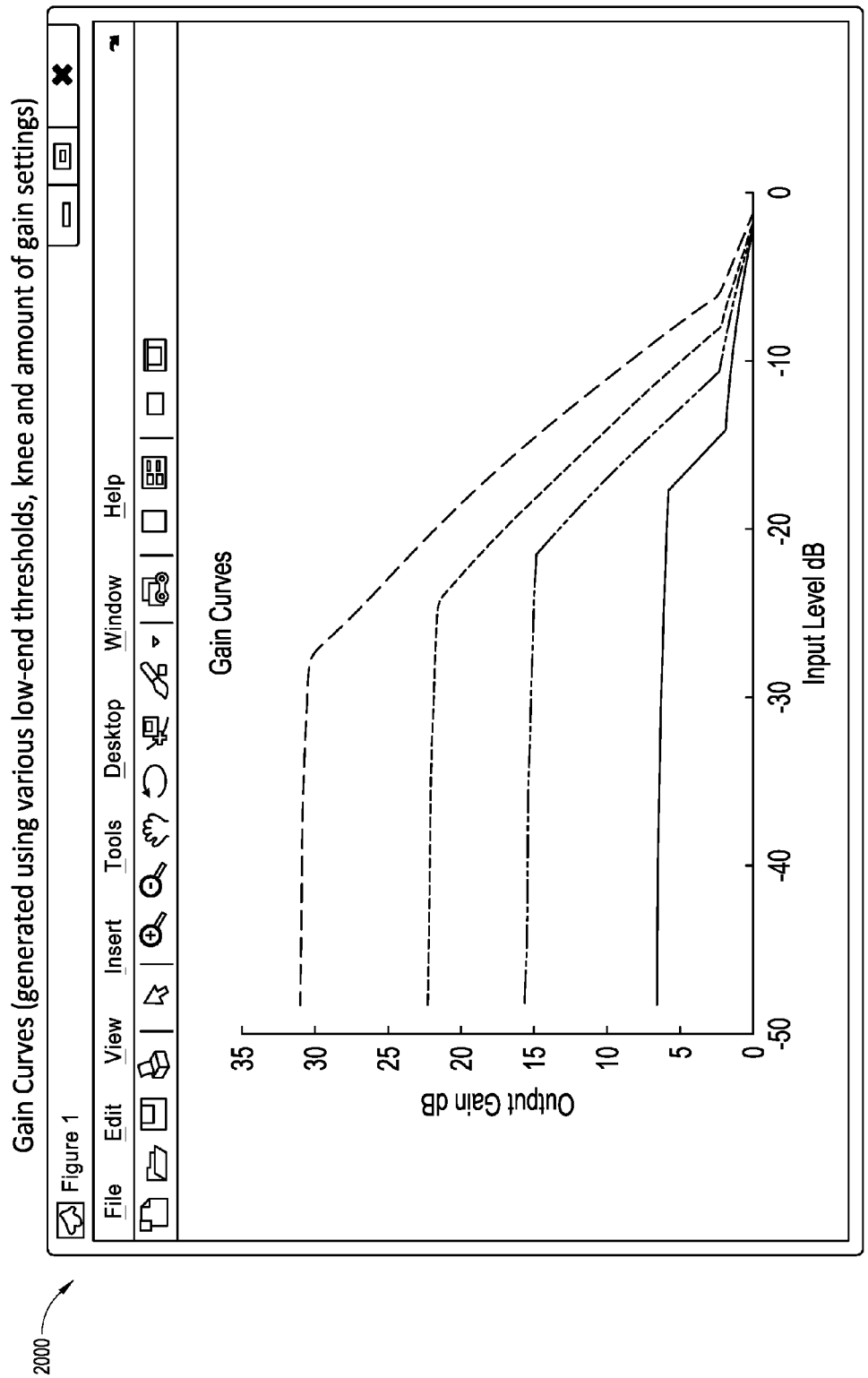
FIG. 20 depicts example gain curves that can be implemented by any of the bass enhancement systems described herein.

FIG. 20 illustrates a plot 2000 of example gain curves that may be implemented in the bass enhancement system 100, for example, in any of blocks 130, 412, 416 (see, e.g., FIG. 4). The gain curves can be tuned differently for block 412 and 416, although this need not be the case. For example, the different gain curves may have different knees, threshold levels, and amount of gain settings (described above with respect to FIG. 4).

Further, it should be noted that any of the low-pass and/or high-pass filters (or other filters described herein) can have any filter order. For example, the order of the filters can 2nd, 3rd, 4th, or higher. The filter order can be selectable in one embodiment to provide higher-order filtering in systems that have the additional processing power to handle such filtering, and lower-order filtering in more resource-constrained systems.

In addition, embodiments of the features described herein can be implemented by, or in conjunction with, the systems and features described in U.S. Pat. No. 6,285,767, titled "Low-Frequency Audio Enhancement System," the disclosure of which is hereby incorporated by reference in its entirety.

Further, for convenience, embodiments of this disclosure describe applying various enhancements (such as gains and/or filters) to an audio signal or input audio signal. It should be understood that in some embodiments, subsequent to a first component described herein applying an enhancement to an input audio signal, a second component can then apply a gain or filter to the enhanced input audio signal output by the first component. For ease of description, however, this disclosure sometimes interchangeably refers to the second component as applying the enhancement to the input audio signal instead of the enhanced input audio signal. It should be understood that much, if not all, of the processing described herein can be implemented in a different time order than that shown and described, and thus this description generically refers to components applying enhancements to the input audio signal even though those components may actually be enhancing a version of the input audio signal that was already enhanced by another component.

III. Example User Interfaces

Figure 23:
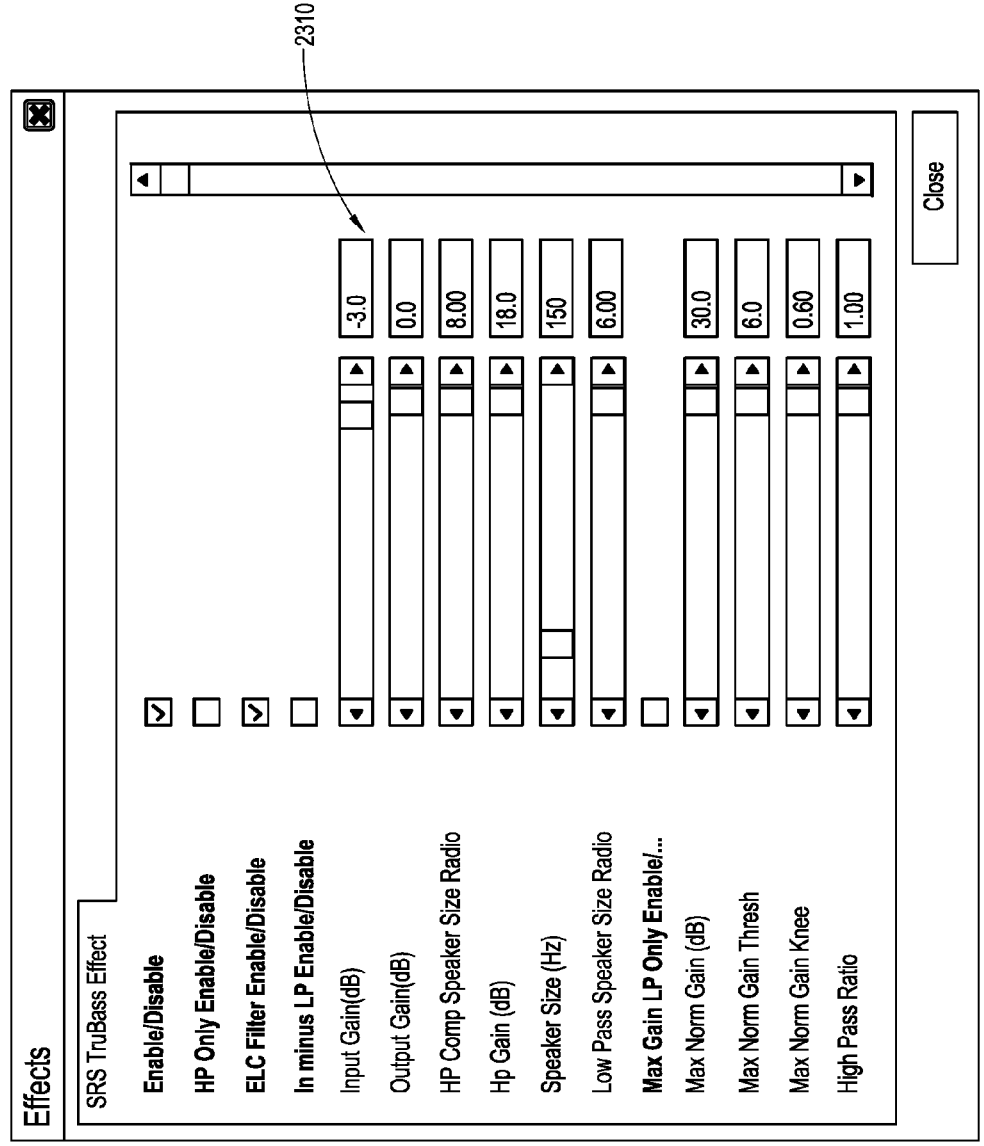
FIGS. 23 and 24 depict example user interfaces for adjusting settings of any of the bass enhancement systems described herein.
Figure 24:
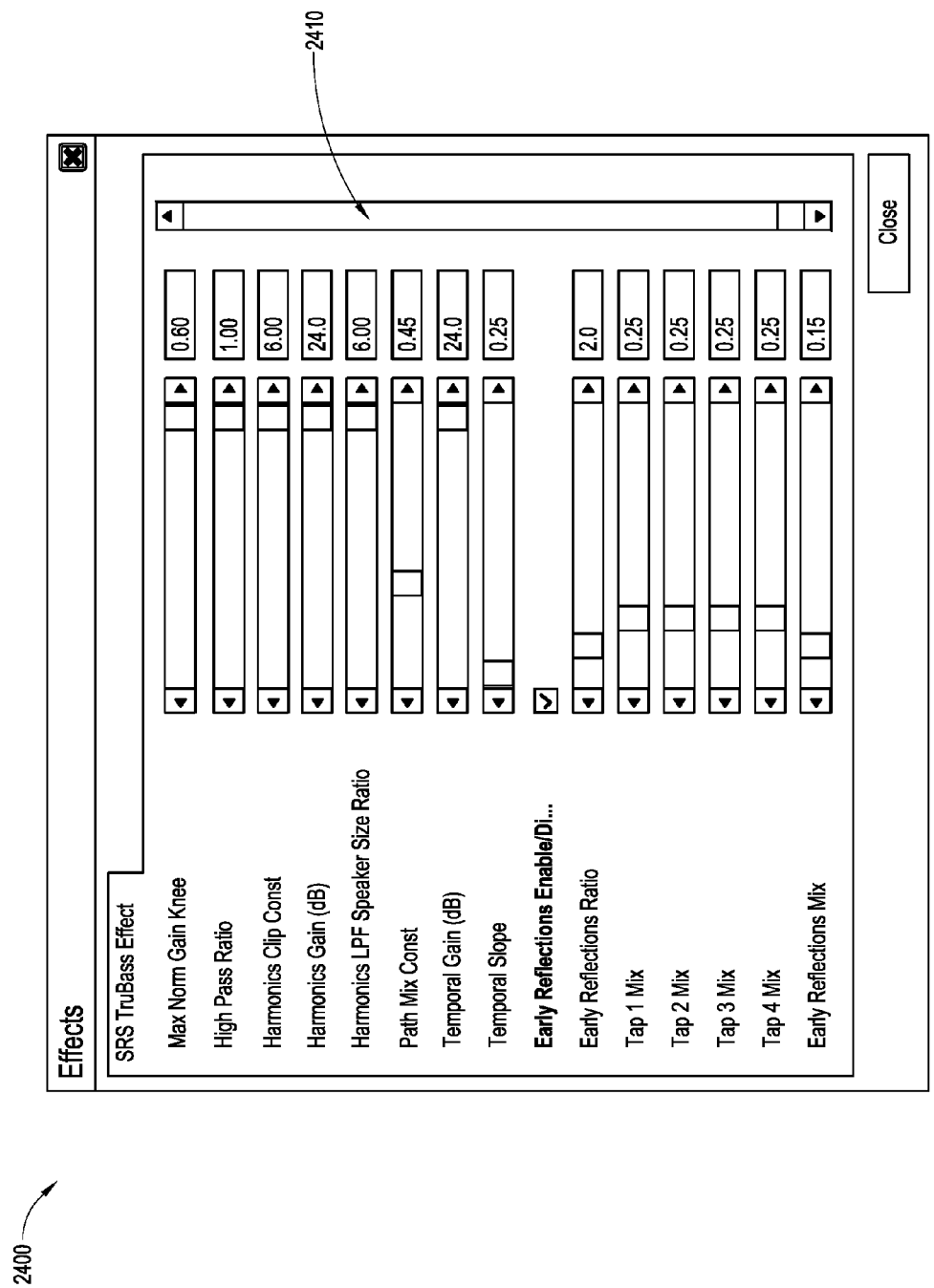

As described above, a field engineer, manufacturer, or end-user (e.g., a listener) can use a user interface to tune the bass enhancement system in a television or other device that implements the bass enhancement system (e.g., any of the bass enhancement systems described herein). FIGS. 23 and 24 depict an example of such a user interface 2300, 2400. The user interface 2400 of FIG. 24 is a continuation of the user interface 2300 of FIG. 23, which user interface 2400 may be reached by scrolling down from the user interface 2300. The user interfaces 2300, 2400 may be implemented in a browser or in an application other than a browser. Further, the user interface 2300, 2400 may be accessed over a network or locally at a device being tuned using the user interfaces 2300, 2400.

The user interfaces 2300, 2400 include numerous user interface controls 2310, 2410 that enable a user to adjust various settings or parameters of the bass enhancement system. Example user interface controls 2310, 2410 shown include check boxes, slide bars, and text boxes. These controls are merely examples, and other types of controls can be used to achieve the same or similar results. Below is an example summary of some aspects of the settings shown in the user interfaces 2300, 2400. Many of these settings are described in greater detail above. The ranges shown for these settings are merely examples and can vary in other embodiments.

Enable/Disable:
This control is used to enable and disable bass processing, including processing by the entire bass enhancement system.
HP Only Enable/Disable:
If this control is enabled, then a high-pass filter only is applied to the signal. The cutoff frequency (Fc) of the high-pass filter can be calculated as: Speaker Size×High Pass Ratio (see below).

ELC Filter Enable/Disable:
Enables the equal loudness curve based filters applied to the harmonic path (e.g., the loudness filter 216 or the like).
In Minus LP Enable/Disable:
When enabled, the unprocessed low-pass path is subtracted from the temporal gain path (e.g., the equalizer 120 or 320 path)_before the temporal gain path is mixed with the harmonic path (e.g., the bass enhancer 110 path, with mixing performed by mixer 112).
Input Gain (dB):
The gain of the signal before being processed by the bass enhancement system may be altered with this control. Because various audio sources can vary in level, this control can allow very low signals to be raised or very high gain signals to be reduced. The control ranges from −60 dB to 0 dB.
Output Gain (dB):
Sets the output gain applied after processing by the bass enhancement system. The Output Gain is specified in decibels and ranges from −60 dB to 0 dB.
HP Comp Speaker Size Ratio:
This control sets the high-pass gain compensation cutoff frequency (Fc) as a ratio of the speaker size. The high-pass compensation Fc is calculated as: HP Comp Ratio×Speaker Size. The range of this control is [1,8].
HP Gain:
This control sets the high-pass gain of the high-pass shelving filter 414 applied to the signal (see FIG. 4). The range of this control is [0, 18] dB.
Speaker Size:
This control sets the speaker size setting. The range of this control is [40, 800] Hz, although other ranges may be used as described above.
Low Pass Speaker Size Ratio:
This control is used to set the Fc of the low-pass filter applied as a ratio of the speaker size: Fc=Low Pass Speaker Size Ratio×Speaker Size. The range of this control is [0.5,6].
Max Gain LP Only Enable/Disable:
When enabled, Max Norm Gain is only applied to the low pass filtered signal. This gain can be implemented by the low-level protected normalization block described above and may, for example, select the gain described above with respect to FIG. 20.
Max Norm Gain:
This control sets the maximum normalization gain that can be applied to the signal (either the low-pass or the broad-band signal depending on the setting of Max Gain LP Only Enable/Disable control). The range of this control is [0, 30] dB. This gain can be implemented by the low-level protected normalization block 412 described above.
Max Norm Gain Thresh:
Sets the threshold for the low-end of the max gain curve implemented by an embodiment of the low-level protected normalization block 412. The range of this control is [10, 6.0].
Max Norm Gain Knee:
Sets the knee of the max gain curve implemented by an embodiment of the low-level protected normalization block 412. The range for this control is [0.1, 0.6].
High Pass Ratio:
This control sets the speaker size ratio of the high-pass filter applied to the signal. The Fc of the high pass filter applied to the signal can be calculated as High Pass Ratio× Speaker Size. The range of this control is [0.1,1].
Harmonics Clip Const:
This control sets the amount of gain applied in the harmonic generation path when generating the harmonics as a percentage of the internally-computed available headroom. The range of this control is [1, 6].

Harmonics Gain:

This control sets the amount of gain applied to the harmonics generation path. The range of this control is [−60, 24] dB. In an embodiment, 0 dB is full scale, and thus any value over 0 dB may cause clipping. In another embodiment, values below 0 dB can cause clipping, depending on the headroom in the audio signal.

Harmonics LPF Speaker Size Ratio:

This control sets the Fc of the harmonics generation low-pass filter path (e.g., block 212 et seq. of FIG. 2) as a ratio of the speaker size. The Fc of the harmonics LPF can be calculated as Harmonics LPF Speaker Size Ratio× Speaker Size. The range of this control is [0.1, 6.0].

Path MIX Const:

This control sets the mix ratio between the harmonic generation path and the temporal gain path. The range of this control is [0, 1]. Higher settings add more harmonic path signal to the mix.

Temporal Gain:

This control sets the temporal gain applied to the signal. The range of this control is [0, 24] dB.

Temporal Slope:

This control sets the slope of the temporal gain filters applied to the signal. The range of this control is [0.25,4].

Early Reflections Enable/Disable:

Enables the early reflections path that is added to the low-pass path.

Tap 1 Mix:

Sets the mixing coefficient of the 1st early reflections tap.

Tap 2 Mix:

Sets the mixing coefficient of the 2nd early reflections tap.

Tap 3 Mix:

Sets the mixing coefficient of the 3rd early reflections tap.

Early Reflections Mix:

Sets the mixing ratio of the early reflections.

Although these parameters may be set individually using the user interfaces of FIGS. 23 and 24 (or user scripts or the like), advantageously, in certain embodiments, it may not be necessary to do so. Instead of requiring a user to tune numerous bass parameters such as those shown on several different types of devices, the bass enhancement system may advantageously enable a user to tune one or a few parameters, and the bass enhancement system can then tune several other parameters based on the user-tuned parameters. For example, the speaker size setting described herein can be selected by a user. Once the speaker size setting is specified, the bass enhancement system can automatically set numerous other parameters as described herein. For example, some or all of the following parameters can depend on the speaker size setting, among others: the cutoff frequency (Fc) of the low pass filter 212; the early reflections mix; gain, center frequency, and/or bandwidth of the equalization filter(s) 312; the gain and/or Fc of the high-pass shelving filter 414; the Fc of the high pass filter 418; and the gain of the low pass filter 242, among possibly other components or parameters. Similarly, as described above, the extended bass control described herein can be user-adjusted, and the resulting extended bass control can affect the Fc and/or gain of the loudness filter(s) 216 and the gain, center frequency, and/or bandwidth of the equalization filter(s) 312. Likewise, the temporal gain control described herein can be user adjusted and then affect the gain, center frequency, and/or bandwidth of the equalization filter(s) 312 and the gain and Fc of the high-pass shelving filter 414.

Thus, once the user inputs a desired speaker size setting, extended bass control, and/or temporal gain control, the bass enhancement system can set numerous other parameters, facilitating rapid tuning of a plurality of different devices and enabling the bass enhancement system to productively enhance bass on numerous different devices.

IV. Additional Embodiments

While the bass enhancement system described herein can provide improved bass in many devices, in some devices with very small speakers, a different benefit may be achieved. In particular, while bass may be enhanced to a degree, one of the benefits of the bass enhancement system is that it may generally enhance vocals by making vocals sound warmer or richer. This benefit is not confined to devices with very small speakers, but may also be present in devices with larger speakers that also exhibit a more pronounced bass effect from the bass enhancement system. The bass enhancement system can therefore provide benefits for voice enhancement, enabling low-bandwidth voice to sound as if more frequencies are present. This benefit can stem at least in part from the addition of harmonics and subharmonics to the vocal frequency range, which can at least partially make up for missing vocal frequencies due to limited bandwidth. Thus, the bass enhancement system can be used as a voice enhancement in cell phones, landline phones, conference call equipment, answering machines, and the like.

Further, the bass enhancement system can be used for enhancing frequency ranges other than bass or low frequencies in some embodiments. For instance, the bass enhancement system can be used to emphasize any subset of frequencies in the audio spectrum, including vocal frequencies higher than typical bass frequencies, treble frequencies, or the like. The speaker size setting described herein may also be used to perform enhancements to a high frequency range, where a speaker also cuts off. The bass enhancement system may also be used to enhance music, including bass frequencies and/or higher frequencies.

V. Terminology

Many other variations than those described herein will be apparent from this disclosure. For example, depending on the embodiment, certain acts, events, or functions of any of the algorithms described herein can be performed in a different sequence, can be added, merged, or left out all together (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. For example, the vehicle management system 110 or 210 can be implemented by one or more computer systems or by a computer system including one or more processors. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. A computing environment can include any type of computer system, including, but not limited to, a computer system based on a microprocessor, a mainframe computer, a digital signal processor, a portable computing device, a personal organizer, a device controller, and a computational engine within an appliance, to name a few.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

What is claimed is:

1. A system for enhancing bass audio, the system comprising:
a bass enhancer implemented in one or more processors, the bass enhancer comprising:
a low pass filter configured to filter an input audio signal to produce a low-pass filtered audio signal;
a harmonics generator implemented in electronic hardware and configured to generate harmonics from the low-pass filtered audio signal, wherein the harmonics generator generates the harmonics based on available headroom in the low-pass filtered audio signal by at least clipping either positive or negative peaks of the low-pass filtered audio signal, wherein clipping either the positive or negative peaks of the low-pass filtered audio signal without rectification reduces processing compared with using rectification to generate harmonics, said clipping comprising applying a gain to a selected one of either the positive or negative peaks of the low-pass filtered audio signal, wherein the gain is greater in value than the available headroom; and
a loudness filter configured to emphasize at least the harmonics generated by the harmonics generator and to supply an output signal for reproduction on a speaker.

2. The system of claim 1, wherein the harmonics generator subsequently applies an inverse of the gain to the selected one of either the positive or negative peaks of the low-pass filtered audio signal.

3. The system of claim 1, further comprising a harmonics tail low pass filter configured to control an amount of the harmonics that are output to the speaker.

4. The system of claim 1, further comprising an equalizer configured to emphasize a portion of the output signal at a speaker size setting prior to the output signal being supplied to the speaker.

5. The system of claim 1, further comprising a level adjuster configured to perform dynamic range compression of the output signal prior to the output signal being supplied to the speaker.

6. A method for enhancing bass audio, the method comprising:
under control of a hardware processor,
receiving an input audio signal;
applying a low pass filter to the input audio signal to produce a low-pass filtered audio signal;
generating harmonics from the low-pass filtered audio signal based on available headroom in the low-pass filtered audio signal by at least clipping either positive or negative peaks of the low-pass filtered audio signal, said clipping comprising applying a gain to a selected one of either the positive or negative peaks of the low-pass filtered audio signal, wherein the gain is greater in value than the available headroom;

applying a gain to at least the harmonics generated by the harmonics generator to produce a bass-enhanced signal; and supplying an output signal based on the bass-enhanced signal to a speaker.

7. The method of claim 6, further comprising generating the harmonics by subsequently applying an inverse of the gain to the selected one of either the positive or negative peaks of the low-pass filtered audio signal.

8. The method of claim 6, further comprising controlling an amount of the harmonics that are output to the speaker with a harmonics tail low pass filter.

9. The method of claim 6, further comprising emphasizing a portion of the output signal at a speaker size setting prior to the output signal being supplied to the speaker.

10. The method of claim 6, further comprising compressing a dynamic range of the output signal prior to the output signal being supplied to the speaker.

* * * * *